US012288749B2

(12) United States Patent
Lee et al.

(10) Patent No.: US 12,288,749 B2
(45) Date of Patent: Apr. 29, 2025

(54) INTEGRATED CIRCUIT CHIP INCLUDING GATE ELECTRODE WITH OBLIQUE CUT SURFACE, AND MANUFACTURING METHOD OF THE SAME

(71) Applicant: Samsung Electronics Co., Ltd., Suwon-si (KR)

(72) Inventors: Inyeal Lee, Seongnam-si (KR); Dongbeen Kim, Suwon-si (KR); Jinwook Kim, Hwaseong-si (KR); Juhun Park, Seoul (KR); Deokhan Bae, Suwon-si (KR); Junghoon Seo, Hwaseong-si (KR); Myungyoon Um, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/647,307

(22) Filed: Apr. 26, 2024

(65) Prior Publication Data
US 2024/0274540 A1    Aug. 15, 2024

Related U.S. Application Data

(63) Continuation of application No. 17/521,080, filed on Nov. 8, 2021, now Pat. No. 11,996,364.

(30) Foreign Application Priority Data

Apr. 16, 2021    (KR) .................. 10-2021-0049825

(51) Int. Cl.
*H01L 23/522*    (2006.01)
*H01L 23/00*    (2006.01)
(Continued)

(52) U.S. Cl.
CPC ........ *H01L 23/535* (2013.01); *H01L 23/5226* (2013.01); *H01L 24/13* (2013.01);
(Continued)

(58) Field of Classification Search
CPC ....... H01L 21/02603; H01L 21/823475; H01L 23/5226; H01L 23/528; H01L 23/535;
(Continued)

(56) References Cited

U.S. PATENT DOCUMENTS 6,681,379 B2    1/2004    Pierrat et al.
6,733,929 B2    5/2004    Pierrat
(Continued)

*Primary Examiner* — David C Spalla
(74) *Attorney, Agent, or Firm* — Harness, Dickey & Pierce, P.L.C.

(57) ABSTRACT

A circuit chip including a substrate, first and second channel active regions on the substrate, and extending in a first direction, the second channel active regions spaced apart from the first channel regions in a second direction intersecting the first direction, first and second gate electrodes intersecting the second channel active regions, third and fourth gate electrodes intersecting the first channel active regions, and a contact electrode between the first, second, third, and fourth gate electrodes. The contact electrode including a stem section in a vertical direction, and first and second branch sections extending from the stem section and contacting a respective source/drain region on the first and second channel active regions, the first gate electrode and the third gate electrode overlapping in the second direction, and including edge portions having widths decreasing as the first gate electrode and the third gate electrode extend toward facing ends thereof.

20 Claims, 17 Drawing Sheets

(51) Int. Cl.
*H01L 23/535* (2006.01)
*H01L 27/092* (2006.01)
*H01L 29/06* (2006.01)
*H01L 29/417* (2006.01)
*H01L 29/423* (2006.01)
*H01L 29/78* (2006.01)
*H01L 29/786* (2006.01)

(52) U.S. Cl.
CPC ...... *H01L 27/0924* (2013.01); *H01L 29/0665* (2013.01); *H01L 29/41733* (2013.01); *H01L 29/41791* (2013.01); *H01L 29/42392* (2013.01); *H01L 29/78391* (2014.09); *H01L 29/7851* (2013.01); *H01L 29/78696* (2013.01); *H01L 2224/13025* (2013.01)

(58) Field of Classification Search
CPC . H01L 24/13; H01L 27/0207; H01L 29/0665; H01L 29/0669; H01L 29/0673; H01L 29/41733; H01L 29/42392; H01L 29/66439; H01L 29/66545; H01L 29/775; H01L 29/78391; H01L 29/78696; H01L 2224/1305

See application file for complete search history.

(56) References Cited

U.S. PATENT DOCUMENTS

| | | | |
|---|---|---|---|
| 6,866,971 B2 | 3/2005 | Pierrat | |
| 7,024,650 B2 | 4/2006 | Teig et al. | |
| 8,969,199 B1 | 3/2015 | Yuan et al. | |
| 9,589,899 B2 | 3/2017 | Jun et al. | |
| 10,199,378 B2 | 2/2019 | Jain et al. | |
| 10,262,941 B2 | 4/2019 | Bouche et al. | |
| 11,563,004 B2 * | 1/2023 | Lee | H01L 27/0207 |
| 2019/0020343 A1 * | 1/2019 | Lee | H01L 27/12 |
| 2019/0148539 A1 * | 5/2019 | Yang | H01L 23/5329 |
| | | | 257/401 |
| 2019/0326407 A1 * | 10/2019 | Yoon | H01L 29/42368 |
| 2020/0144383 A1 * | 5/2020 | Nakano | H01L 29/4958 |
| 2020/0144384 A1 | 5/2020 | Sagong et al. | |
| 2022/0102359 A1 | 3/2022 | Su et al. | |

* cited by examiner

US 12,288,749 B2

INTEGRATED CIRCUIT CHIP INCLUDING GATE ELECTRODE WITH OBLIQUE CUT SURFACE, AND MANUFACTURING METHOD OF THE SAME

CROSS-REFERENCE TO THE RELATED APPLICATION

This is a continuation of U.S. application Ser. No. 17/521,080, filed Nov. 8, 2021 which claims priority to Korean Patent Application No. 10-2021-0049825, filed on Apr. 16, 2021, the disclosures of each of which are hereby incorporated by reference in their entirety.

BACKGROUND

1. Field

The example embodiments of the disclosure relate to integrated circuit chips including a gate electrode with an oblique cut surface, and manufacturing methods of the same.

2. Description of the Related Art

Generally, standard cells may be used for design of an integrated circuit. The standard cells are cells having a predetermined (e.g., desired) architecture. Such standard cells are stored in a cell library. In design of an integrated circuit, standard cells are extracted from a cell library, and are then disposed at appropriate positions on a layout of the integrated circuit. Thereafter, routing is performed to electrically interconnect the disposed standard cells.

In design of an integrated circuit, a gate electrode generally has a linearly cut shape without definition of a particular shape of an end thereof.

SUMMARY

The example embodiments of the disclosure provide gate electrode structures capable of preventing or reducing the occurrence of short circuit between a gate electrode and a contact electrode adjacent to the gate electrode, and manufacturing methods of the same.

The example embodiments of the disclosure also provide gate electrodes having an oblique cut structure at an end thereof, and manufacturing methods thereof.

In one embodiment of the inventive concepts, an integrated circuit chip including a substrate, first channel active regions on the substrate, and extending in a first direction, second channel active regions on the substrate, and extending in the first direction, the second channel active regions being spaced apart from the first channel regions in a second direction intersecting the first direction, a first gate electrode and a second gate electrode which intersect the second channel active regions, a third gate electrode and a fourth gate electrode which intersect the first channel active regions, and a contact electrode between the first gate electrode and the second gate electrode and between the third gate electrode and the fourth gate electrode, the contact electrode including a stem section in a vertical direction, a first branch section extending from the stem section in one direction and contacting a source/drain region on the first channel active regions, and a second branch section extending from the stem section in the other direction and contacting a source/drain region on the second channel active regions, wherein the first gate electrode and the third gate electrode overlap with each other in the second direction, and include edge portions having widths decreasing gradually as the first gate electrode and the third gate electrode extend toward facing ends thereof, respectively.

In one embodiment of the inventive concepts, an integrated circuit chip including a substrate, a front-end-of-line (FEOL) structure on the substrate, a back-end-of-line (BEOL) structure on the FEOL structure, the BEOL structure including a plurality of wiring layers, and bumps on the BEOL structure, wherein the FEOL structure includes first channel active regions protruding from the substrate, and extending in a first direction, second channel active regions protruding from the substrate, and extending in the first direction, the second channel active regions being spaced apart from the first channel regions in a second direction intersecting the first direction. a first gate electrode and a second gate electrode which intersect the second channel active regions, a third gate electrode and a fourth gate electrode which intersect the first channel active regions, and a contact electrode between the first gate electrode and the second gate electrode and between the third gate electrode and the fourth gate electrode, wherein the contact electrode includes a stem section in a vertical direction, a first branch section extending from the stem section in one direction and contacting a source/drain region on the first channel active regions, and a second branch section extending from the stem section in the other direction and contacting a source/drain region on the second channel active regions, wherein the first gate electrode and the third gate electrode overlap with each other in the second direction, and include edge portions having widths decreasing gradually as the first gate electrode and the third gate electrode extend toward facing ends thereof, respectively.

In one embodiment of the inventive concepts, an integrated circuit chip including a substrate, first channel active regions on the substrate while extending in a first direction, second channel active regions on the substrate while extending in the first direction, the second channel active regions being spaced apart from the first channel regions in a second direction intersecting the first direction, a first gate electrode and a second gate electrode which intersect the second channel active regions, a third gate electrode and a fourth gate electrode which intersect the first channel active regions, and a contact electrode between the first gate electrode and the second gate electrode and between the third gate electrode and the fourth gate electrode, wherein the contact electrode includes a stem section in a vertical direction, a first branch section extending from the stem section in one direction and contacting a source/drain region on the first channel active regions, and a second branch section extending from the stem section in the other direction and contacting a source/drain region on the second channel active regions, wherein the first gate electrode and the third gate electrode overlap with each other in the second direction, and include edge portions having widths decreasing gradually as the first gate electrode and the third gate electrode extend toward facing ends thereof, respectively, wherein the second gate electrode and the fourth gate electrode overlap with each other in the second direction, and include edge portions having widths decreasing gradually as the second gate electrode and the fourth gate electrode extend toward facing ends thereof, respectively, wherein a distance of each of the edge surfaces of the first to fourth gate electrodes from the contact electrode in the first direction increases gradually as the edge surface extends toward a corresponding one of the facing ends, wherein the first branch section includes a portion overlapping with a portion of the third gate electrode in the first direction, except for the edge portion at the third gate electrode, wherein the second branch section includes a portion overlapping with a portion of the first gate electrode in the first direction, except for the edge portion at the first gate electrode.

DETAILED DESCRIPTION OF EXAMPLE EMBODIMENTS

Figure 1:
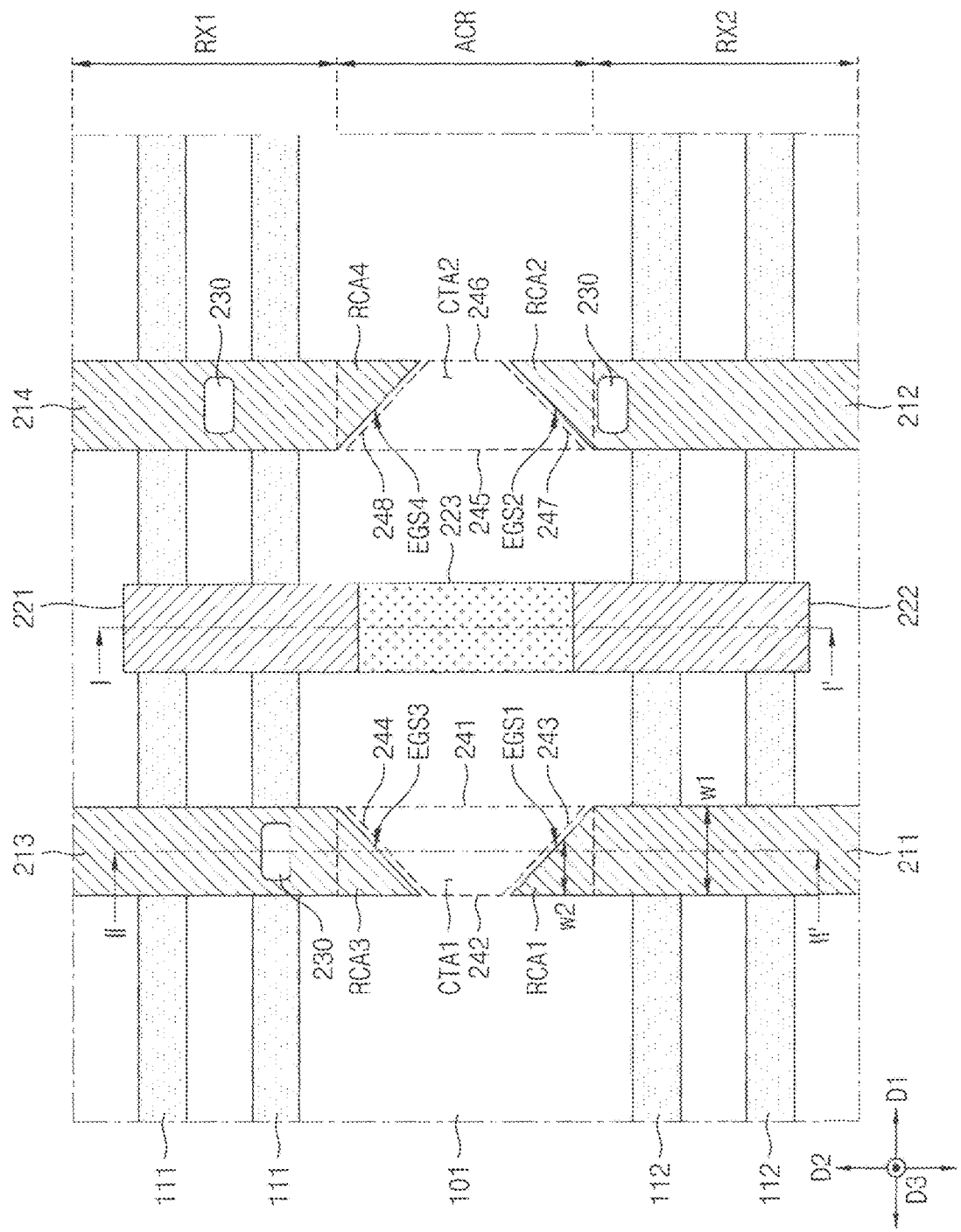
FIG. 1 is a layout of an integrated circuit chip according to an example embodiment of the disclosure.
Figure 2:
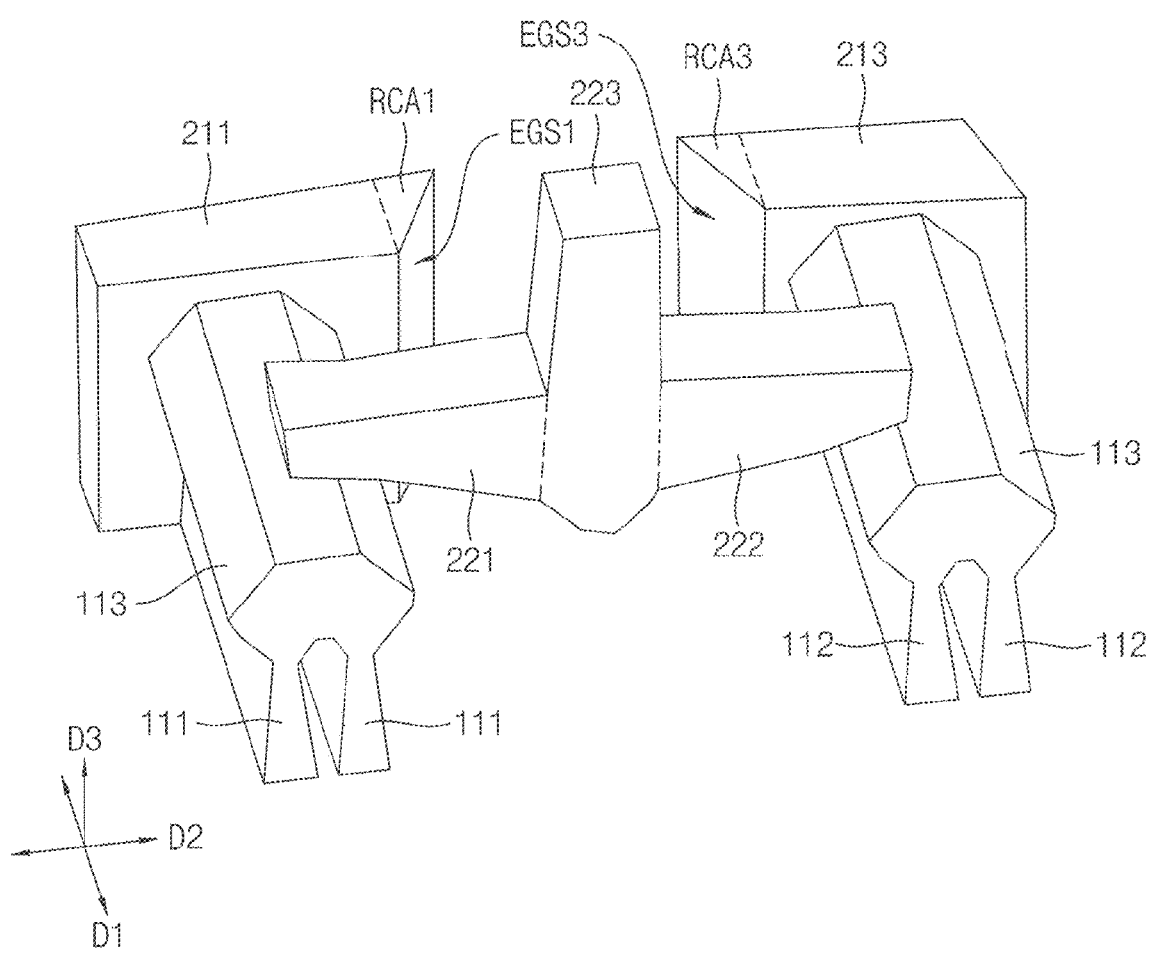
FIG. 2 is a three-dimensional view explaining arrangement relation among gate electrodes, channel active regions, and a first contact electrode which are shown in FIG. 1.

FIG. 1 is a layout of an integrated circuit chip according to an example embodiment of the disclosure. FIG. 2 is a three-dimensional view explaining arrangement relation among gate electrodes, channel active regions, and a first contact electrode which are shown in FIG. 1.

Referring to FIG. 1, the integrated circuit chip may include a substrate 101, a plurality of channel active regions (or fin-type channel active regions) 111 and 112 extending in a first direction D1 while protruding from the substrate 101, a first contact electrode 221~223 (e.g., including branches 221, 222, and 223) electrically connected to the channel active regions 111 and 112, a plurality of gate electrodes 211 to 214 (e.g., gate electrode 211, gate electrode 212, gate electrode 213, gate electrode 214) extending in a second direction D2 intersecting the first direction D1, and second contact electrodes 230 electrically connected to the gate electrodes 211 to 214. In some example embodiments, the second contract electrodes 230 may electrically connect one or more of the gate electrodes 211 to 214.

A first element region RX1 and a second element region RX2, in which the plurality of channel active regions 111 and 112 are formed, and an active cut region ACR separating the first element region RX1 and the second element region RX2 from each other may be defined in the substrate 101.

The plurality of channel active regions 111 and 112 may extend in parallel in the first direction D1. The plurality of channel active regions 111 and 112 may be arranged in the second direction D2. The plurality of channel active regions 111 and 112 may include first channel active regions 111 formed in the first element region RX1, and second channel active regions 112 formed in the second element region RX2.

The plurality of gate electrodes 211 to 214 may extend in substantially the second direction D2. In some example embodiments, the plurality of gate electrodes 221-214 may extend in a direction D2 intersecting direction D1 at an acute, perpendicular, or obtuse angle. A part of the plurality of gate electrodes 211 to 214 extending in one direction may have a separated pattern through removal of a portion thereof. Each of the gate electrodes 211 to 214 may intersect the plurality of channel active regions 111 and 112.

A part of the gate electrodes 211 to 214 may be formed to include, at one-side ends thereof, edge portions RCA1 to RCA4 (e.g., edge portion RCA1, edge portion RCA2, edge portion RCA3, and edge portion RCA4) obliquely recessed with respect to the second direction D2 (or the first direction D1) when viewed in a plan view. Each of the edge portions RCA1 to RCA4 may be defined as a region having a second width w2 smaller than a first width w1 in a region other than an end of a corresponding one of the gate electrodes 211 to 214. The part of the gate electrodes 211 to 214 may include edge surfaces EGS1 to EGS4 (e.g., edge surface EGS1, edge surface EGS2, edge surface EGS3, and edge surface EGS4) in respective edge portions RCA1 to RCA4. Here, each of the edge surfaces EGS1 to EGS4 may be a surface having a width formed in a direction oblique with respect to the second direction D2 (or the first direction D1) and a height formed in a third direction D3.

In some example embodiments, the plurality of gate electrodes 211 to 214 may include a first gate electrode 211, a second gate electrode 212, a third gate electrode 213 and a fourth gate electrode 214 which are formed at positions adjacent to the first contact electrode 221~223, respectively.

The first gate electrode 211 and the second gate electrode 212 may overlap with each other in the first direction D1. The third gate electrode 213 and the fourth gate electrode 214 may overlap with each other in the first direction D1. The first gate electrode 211 and the third gate electrode 213 may be formed on a virtual line formed in the second direction D2. The second gate electrode 212 and the fourth gate electrode 214 may be formed on a virtual line formed in the second direction D2.

In some example embodiments, the first gate electrode 211, the second gate electrode 212, the third gate electrode 213 and the fourth gate electrode 214 may have the edge portions RCA1 to RCA4, respectively. For example, the first gate electrode 211, the second gate electrode 212, the third gate electrode 213 and the fourth gate electrode 214 may have a first edge portion RCA1, a second edge portion RCA2, a third edge portion RCA3 and a fourth edge portion RCA4, respectively. In some example embodiments, a width w2 of each of the first edge portion RCA1 and the third edge portion RCA3 may decrease gradually as each of the first edge portion RCA1 and the third edge portion RCA3 extends toward an end thereof (for example, an end at which the first gate electrode 211 and the third gate electrode 213 face each other while being spaced apart from each other by a minimum distance). The width of each of the second edge portion RCA2 and the fourth edge portion RCA4 may decrease gradually as each of the second edge portion RCA2 and the fourth edge portion RCA4 extends toward an end thereof (for example, an end at which the second edge portion RCA2 and the fourth edge portion RCA4 face each other while being spaced apart from each other by a minimum distance). For example, each of the first edge portion RCA1, the second edge portion RCA2, the third edge portion RCA3 and the fourth edge portion RCA4 may have a triangular shape. For example, a triangular shape may be one of a right triangle, an acute triangle, an obtuse triangle, an equilateral triangle, an isosceles triangle, or a scalene triangle.

A first edge surface EGS1, a second edge surface EGS2, a third edge surface EGS3 and a fourth edge surface EGS4 may be formed at the first edge portion RCA1, the second edge portion RCA2, the third edge portion RCA3 and the fourth edge portion RCA4, respectively. In some example embodiments, the distance of each of the first edge surface EGS1 and the third edge surface EGS3 from the first contact electrode 221~223 in the first direction D1 may increase gradually as each of the first edge surface EGS1 and the third edge surface EGS3 extends toward an end thereof at which the first edge surface EGS1 and the third edge surface EGS3 face each other while being spaced apart from each other by a minimum distance. The distance of each of the second edge surface EGS2 and the fourth edge surface EGS4 from the first contact electrode 221~223 in the first direction D1 may increase gradually as each of the second edge surface EGS2 and the fourth edge surface EGS4 extends toward an end thereof at which the second edge surface EGS2 and the fourth edge surface EGS4 face each other while being spaced apart from each other by a minimum distance.

A first cutting area CTA1, in which no gate electrode is formed, may be defined between the first gate electrode 211 and the third gate electrode 213. For example, the first cutting area CTA1 may be a region between the first edge surface EGS1 formed at the first gate electrode 211 and the third edge surface EGS3 formed at the third gate electrode 213. The entire portion of the first cutting area CTA1 may overlap with the first gate electrode 211 and the third gate electrode 213 in the second direction D2. A second cutting area CTA2, in which no gate electrode is formed, may be defined between the second gate electrode 212 and the fourth gate electrode 214. For example, the second cutting area CTA2 may be a region between the second edge surface EGS2 formed at the second gate electrode 212 and the fourth edge surface EGS4 formed at the fourth gate electrode 214. The entire portion of the second cutting area CTA2 may overlap with the second gate electrode 212 and the fourth gate electrode 214 in the second direction D2. The first cutting area CTA1 may include a portion overlapping with the second cutting area CTA2 in the first direction D1. The first cutting area CTA1 and the second cutting area CTA2 may be included in the active cut region ACR. The first cutting area CTA1 and the second cutting area CTA2 may be virtual areas having a shape determined by (depending on) shapes and positions of the first gate electrode 211 and the third gate electrode 213 and a shape determined by (depending on) shapes and positions of the second gate electrode 212 and the fourth gate electrode 214, respectively.

In some example embodiments, the first cutting area CTA1 may have a trapezoidal shape when viewed in a plan view. For example, the first cutting area CTA1 may include a first side 241 connecting one side of the first gate electrode 211 and one side of the third gate electrode 213, a second side 242 connecting the other side of the first gate electrode 211 and the other side of the third gate electrode 213, a third side 243 contacting the first edge surface EGS1 of the first gate electrode 211, and a fourth side 244 contacting the third edge surface EGS3 of the third gate electrode 213. Here, the position of the first side 241 may be nearer to the first contact electrode 221~223 than the position of the second side 242.

The third side 243 may have a shape corresponding to the shape of the first edge surface EGS1, and the fourth side 244 may have a shape corresponding to the shape of the third edge surface EGS3. The third side 243 may connect one end of the first side 241 and one end of the second side 242, and the fourth side 244 may connect the other end of the first side 241 and the other side of the second side 242. In some example embodiments, the width of the first cutting area CTA1 in the second direction D2 may decrease gradually as the first cutting area CTA1 extends away from the first contact electrode 211~213 in the first direction D1.

In some example embodiments, the second cutting area CTA2 may have a trapezoidal shape when viewed in a plan view. For example, the shape of the second cutting area CTA2 may be symmetrical about the first contact electrode 221~223 to the shape of the first cutting area CTA1. For example, the second cutting area CTA2 may include a fifth side 245 connecting one side of the second gate electrode 212 and one side of the fourth gate electrode 214, a sixth side 246 connecting the other side of the second gate electrode 212 and the other side of the fourth gate electrode 214, a seventh side 247 contacting the second edge surface EGS2 of the second gate electrode 212, and an eighth side 248 contacting the fourth edge surface EGS4 of the fourth gate electrode 214. Here, the position of the fifth side 245 may be nearer to the first contact electrode 221~223 than the position of the sixth side 246. The seventh side 247 may have a shape corresponding to the shape of the second edge surface EGS2, and the eighth side 248 may have a shape corresponding to the shape of the fourth edge surface EGS4. The seventh side 247 may connect one end of the fifth side 245 and one end of the sixth side 246, and the eighth side 248 may connect the other end of the fifth side 245 and the other side of the sixth side 246. In some example embodiments, the width of the second cutting area CTA2 in the second direction D2 may decrease gradually as the second cutting area CTA2 extends away from the first contact electrode 211~213 in the first direction D1.

In some example embodiments, angles respectively formed between the first side 241 and the third side 243, between the first side 241 and the fourth side 244, between the fifth side 245 and the seventh side 247, and between the fifth side 245 and the eighth side 248 may be acute angles. For example, each of the angles respectively formed between the first side 241 and the third side 243, between the first side 241 and the fourth side 244, between the fifth side 245 and the seventh side 247, and between the fifth side 245 and the eighth side 248 may be set to greater than or equal to about or exactly 22.5° to less than or equal to about or exactly 67.5°.

In some example embodiments, the first contact electrode 221~223 may include a stem section 223 formed in a vertical direction, that is, the third direction D3, and a plurality of branches 221 and 222 extending from the stem section 223 in opposite sides of the second direction D2. For example, the first contact electrode 221~223 may include the stem section 223, a first branch section 221 extending from the stem section 223 in one side (for example, an upper side) of the second direction D2, and a second branch section 222 extending from the stem section 223 in the other side (for example, a lower side) of the second direction D2. The height (or the thickness) in the third direction D3 of the stem section 223 may be greater (e.g., thicker) than the heights (or the thicknesses) in the third direction D3 of the plurality of branch sections 221 and 222.

The first contact electrode 221~223 may be disposed in the active cut region ACR. In some example embodiments, the entire portion of the stem section 223 of the first contact electrode 221~223 may overlap with the first cutting area CTA1 and the second cutting area CTA2 in the first direction D1.

The first branch section 221 may intersect the first channel active regions 111 disposed in the first element region RX1. The first branch section 221 may contact a source/drain region 113 formed on the first channel active regions 111. The second branch section 222 may intersect the second channel active regions 112 disposed in the second element region RX2. The second branch section 222 may contact a source/drain region 113 formed on the second channel active regions 112. In some example embodiments, each of the first channel active regions 111 and the second channel active regions 112 may be electrically connected to the first contact electrode 221~223 and a corresponding one of the source/drain regions 113.

In some example embodiments, the first branch section 221 may overlap with portions of the third gate electrode 213 and the fourth gate electrode 214 other than the edge portions RCA3 and RCA4 in the first direction D1. The second branch section 222 may overlap with portions of the first gate electrode 221 and the second gate electrode 212 other than the edge portions RCA1 and RCA2 in the first direction D1.

When the distance between facing ones of the gate electrodes 211 to 214 in the second direction D2 is small, the possibility that a short circuit may occur between the gate electrodes 211 to 214 and the first contact electrode 221~223 may increase. On the other hand, when the distance between facing ones of the gate electrodes 211 to 214 in the second direction D2 is great, a difficulty in removing a gate sacrificial material ("210a" in FIG. 5) for formation of the gate electrodes 211 to 214 may increase. When facing ends of the gate electrodes 211 to 214 are obliquely formed, it may be possible not only to reduce difficulty in removing the gate sacrificial material, but also to reduce the possibility that short circuits occur between the gate electrodes 211 to 214 and the first contact electrode 221~223.

Figure 3:
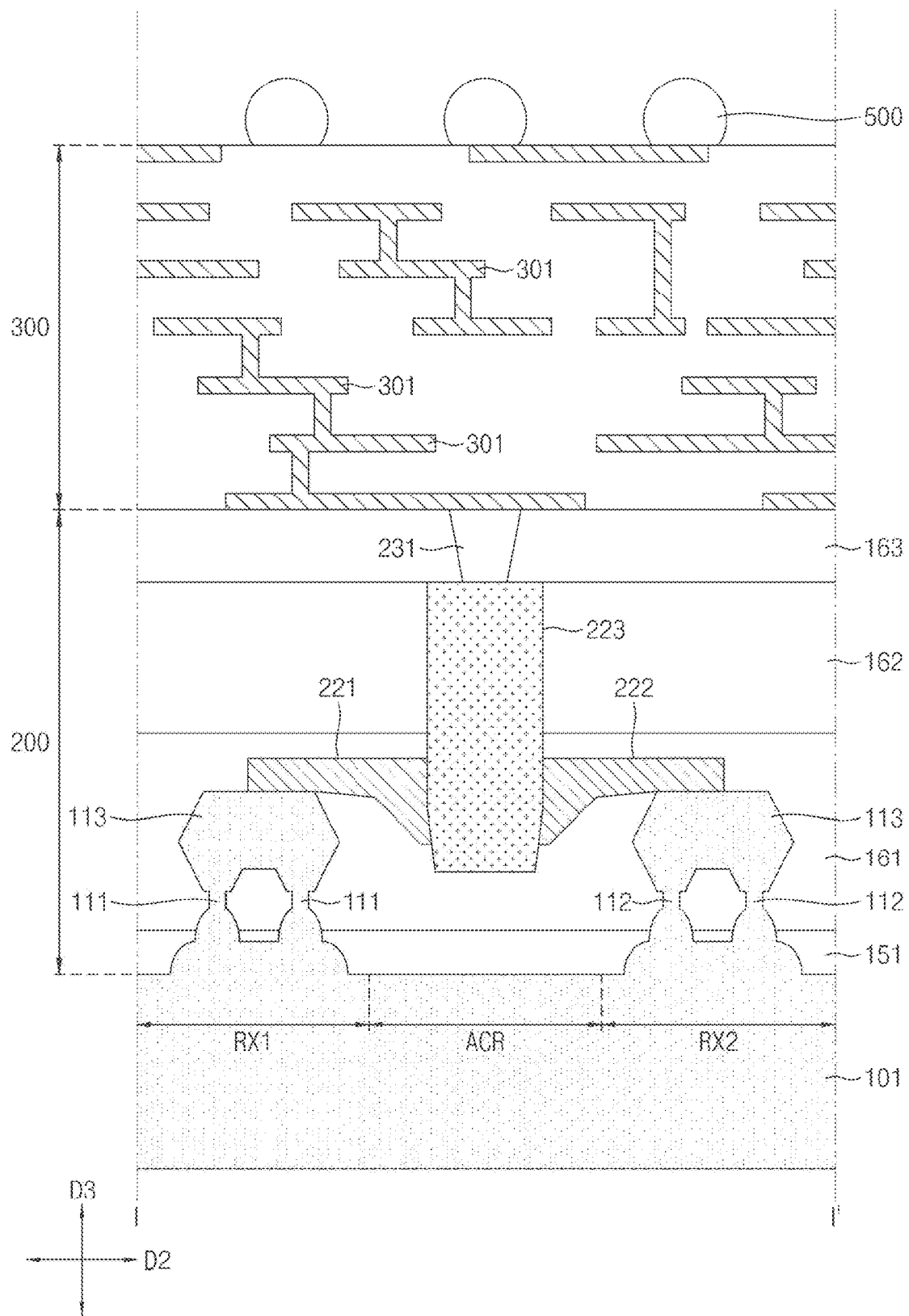
FIG. 3 is a cross-sectional view of an integrated circuit chip corresponding to line I-I' in FIG. 1.
Figure 4:
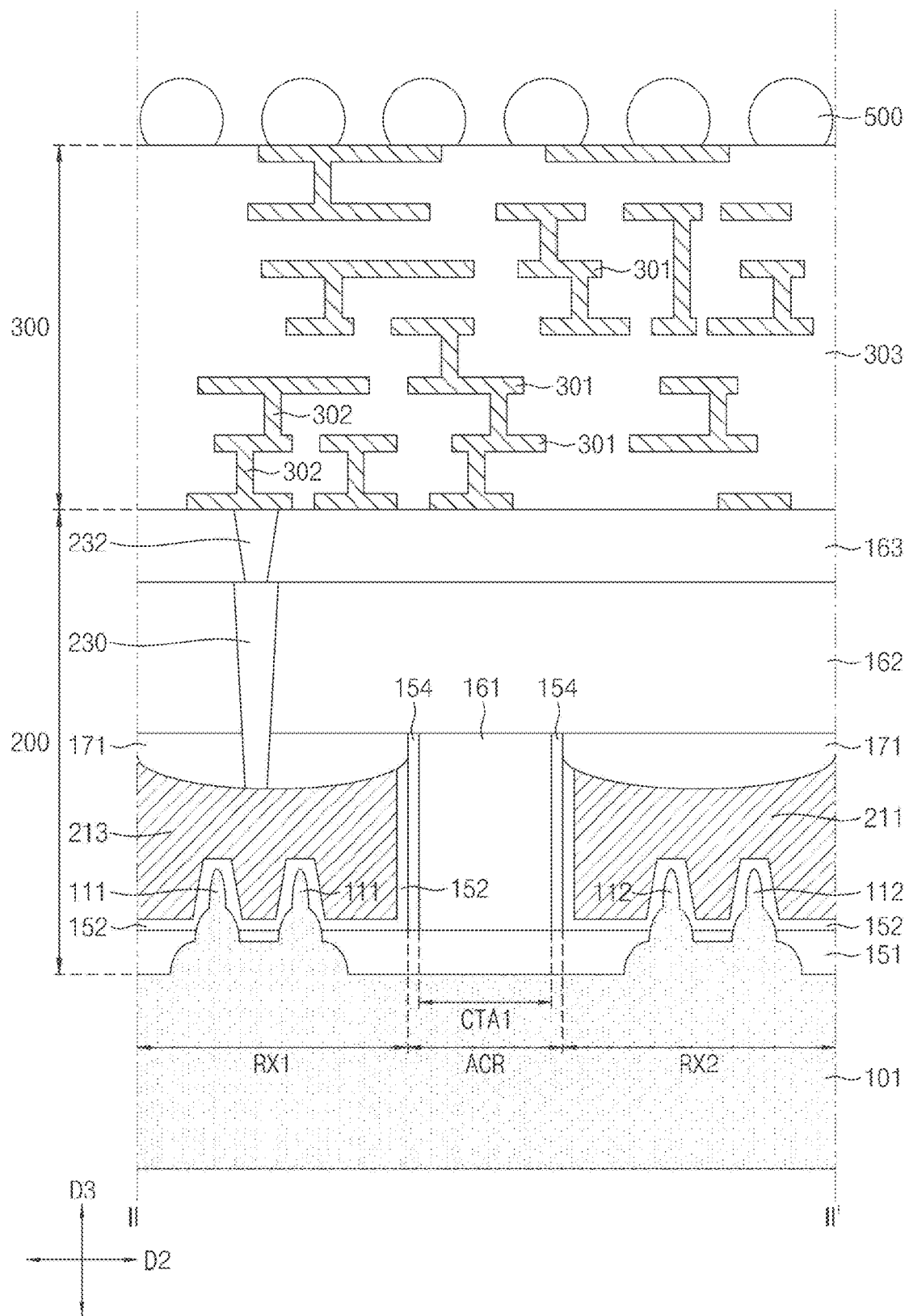
FIG. 4 is a cross-sectional view of the integrated circuit chip corresponding to line II-II' in FIG. 1.

FIG. 3 is a cross-sectional view of an integrated circuit chip corresponding to line I-I' in FIG. 1. FIG. 4 is a cross-sectional view of the integrated circuit chip corresponding to line II-II' in FIG. 1.

Referring to FIGS. 1 to 4, the integrated circuit chip may include a substrate 101. The substrate 101 may include at least one semiconductor material. For example, the semiconductor material may be Si, Ge, SiGe, GaP, GaAs, SiC, SiGeC and/or InP. In some example embodiments, the substrate 101 may be a bulk substrate (for example, a bulk silicon substrate) or a semiconductor-on-insulator substrate.

The substrate 101 may include channel active regions 111 and 112 protruding upwards from one surface (for example, an active surface) of the substrate 101. For example, the channel active regions 111 and 112 may protrude from the substrate 101 in a third direction D3. The channel active regions 111 and 112 may include a well doped with an impurity or a conductive region doped with an impurity. For example, the doped conductive region may be an n-type doped region or a p-type doped region.

A front-end-of-line (FEOL) structure 200 may be disposed on the substrate 101. The FEOL structure 200 may be formed through an FEOL process. The FEOL process may refer to a process for forming individual elements, for example, a transistor, a capacitor, a resistor, etc., on the substrate 101 in a manufacturing procedure for the integrated circuit chip. For example, the FEOL process may include planarization and cleaning of a wafer, formation of a trench, formation of a well, formation of a gate line, formation of a source and drain, etc.

The FEOL structure 200 may constitute a logic cell including a fin field effect transistor (FinFET). Of course, the FEOL structure 200 is not limited to the above-described condition, and may constitute a logic cell including a metal-oxide-semiconductor field effect transistor (MOSFET), a system large-scale integration (LSI) device, a microelectromechanical system (MEMS), an active device, or a passive device which includes a plurality of transistors, so long as the scope and spirit of the disclosure are not changed.

The integrated circuit chip may include a lower insulating film 151 disposed on the substrate 101. The lower insulating film 151 may extend to have a predetermined (e.g., desired) thickness on opposite side surfaces of the channel active regions 111 and 112 and on the substrate 101. The lower insulating film 151 may be disposed around lower portions of the opposite side surfaces of the channel active regions 111 and 112. The lower insulating film 151 may include an insulating material. For example, the lower insulating film 151 may include silicon oxide, silicon nitride and/or silicon oxynitride.

The protrusion height of the channel active regions 111 and 112 may be greater than the thickness of the lower insulating film 151. That is, the channel active regions 111 and 112 may have a shape protruding from the lower insulating film 151 while extending through the lower insulating film 151.

A gate insulating film 152 may be disposed on a portion of the lower insulating film 151. The gate insulating film 152 may be constituted by a silicon oxide film, a high-k dielectric film, or a combination thereof. The gate insulating film 152 may be formed through an atomic layer deposition (ALD) process, a chemical vapor deposition (CVD) process, or a physical vapor deposition (PVD) process.

Gate electrodes 211 to 214 may be disposed on portions of the channel active regions 111 and 112. The gate electrodes 211 to 214 may be disposed on the gate insulating film 152. In some example embodiments, the gate electrodes 211 to 214 may have a structure in which a metal nitride layer, a metal layer, a conductive capping layer, and a gap-fill metal film are sequentially stacked.

In some example embodiments, the gate insulating film 152 may be disposed at bottom portions and side portions of the gate electrodes 211 to 214.

In some example embodiments, the integrated circuit chip may include a negative capacitance (NC) FET using a negative capacitor. For example, the gate insulating film 152 may include a ferroelectric material film having ferroelectric characteristics, and a paraelectric material film having paraelectric characteristics.

The ferroelectric material film may have a negative capacitance, and the paraelectric material film may have a positive capacitance. For example, when two or more capacitors are connected in series, and the capacitance of each of the capacitors has a positive value, the total capacitance of the capacitors may be lower than the capacitance of each individual capacitor. On the other hand, when at least one of the capacitances of two or more capacitors connected in series has a negative value, the total capacitance of the capacitors may have a positive value and may be greater than an absolute value of the capacitance of each individual capacitor.

When a ferroelectric material film having a negative capacitance and a paraelectric material film having a positive capacitance are connected in series, the total capacitance of the ferroelectric material film and the paraelectric material film connected in series may increase. A transistor including a ferroelectric material film may have subthreshold swing (SS) of less than about or exactly 60 mV/decade at normal temperature (e.g., about or exactly 25° C.), using an increase in total capacitance as described above.

The ferroelectric material film may have ferroelectric dielectric characteristics. The ferroelectric material film may include, for example, at least one of hafnium oxide, hafnium zirconium oxide, barium strontium oxide, barium titanium oxide, and lead zirconium titanium oxide. Here, for example, hafnium zirconium oxide may be a material produced by doping hafnium oxide with zirconium (Zr). In another example, hafnium zirconium oxide may be a compound of hafnium (Hf), zirconium (Zr), and oxygen (O).

The ferroelectric material film may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The kind of the dopant included in the ferroelectric material film may be varied in accordance with which ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include greater than or equal to about or exactly 3 to less than or equal to about or exactly 8 atomic % (at %) of aluminum. Here, the ratio of the dopant may be the ratio of aluminum to the sum of hafnium and aluminum.

When the dopant is silicon (Si), the ferroelectric material film may include greater than or equal to about or exactly 2 to less than or equal to about or exactly 10 at % of silicon. When the dopant is yttrium (Y), the ferroelectric material film may include greater than or equal to about or exactly 2 to less than or equal to about or exactly 10 at % of yttrium. When the dopant is gadolinium (Gd), the ferroelectric material film may include greater than or equal to about or exactly 1 to less than or equal to about or exactly 7 at % of gadolinium. When the dopant is zirconium (Zr), the ferroelectric material film may include greater than or equal to about or exactly 50 to less than or equal to about or exactly 80 at % of zirconium.

The paraelectric material film may have paraelectric characteristics. The paraelectric material film may include, for example, at least one of silicon oxide and a metal oxide having a high dielectric constant. The metal oxide included in the paraelectric material film may include, for example, at least one of hafnium oxide, zirconium oxide, and aluminum oxide, without being limited thereto.

The ferroelectric material film and the paraelectric material film may include the same material. The ferroelectric material film has ferroelectric characteristics, but the paraelectric material film may not have ferroelectric characteristics. For example, when both the ferroelectric material film and the paraelectric material film include hafnium oxide, the crystalline structure of the hafnium oxide included in the ferroelectric material film may differ from the crystalline structure of the hafnium oxide included in the paraelectric material film.

The ferroelectric material film may have a thickness exhibiting ferroelectric characteristics. The thickness of the ferroelectric material film may be, for example, greater than or equal to about or exactly 0.5 to less than or equal to about or exactly 10 nm, without being limited thereto. The critical thickness exhibiting ferroelectric characteristics may be varied in accordance with different ferroelectric materials and, as such, the thickness of the ferroelectric material film may be varied in accordance with the ferroelectric material thereof.

For example, the gate insulating film 152 may include one ferroelectric material film. In another example, the gate insulating film 152 may include a plurality of ferroelectric material films spaced apart from one another. In this case, the gate insulating film 152 may have a stacked film structure in which a plurality of ferroelectric material films and a plurality of paraelectric material films are alternately stacked.

A gate capping layer 171 may be formed on the gate electrodes 211 to 214. In some example embodiments, the gate capping layer 171 may be omitted, or may be removed only from a region where a second contact electrode 230 for connecting the gate electrodes 122 to 214 to a structure thereover is formed.

A spacer 154 may be formed to surround side portions of the gate insulating film 152, the gate electrodes 211 to 214 and the gate capping layer 171. In some example embodiments, the spacer 154 may be omitted from a predetermined (e.g., desired) region. In this case, the gate insulating film 152 may directly contact a first interlayer insulating film 161.

A combination of the gate insulating film 152, the gate electrodes 211 to 214, the gate capping layer 171 and the spacer 154 may refer to a gate structure.

The first interlayer insulating film 161 may be formed between gate structures. For example, the first interlayer insulating film 161 may be constituted by a silicon oxide film, a silicon nitride film, a silicon oxynitride film, or a combination thereof. In some example embodiments, the first interlayer insulating film 161 may include materials distinguished from each other in cutting areas CTA1 and CTA2 and regions other than the cutting areas CTA1 and CTA2. In this case, in the cutting areas CTA1 and CTA2, the first interlayer insulating film 161 may include, as a filling material, SiN, etc. distinguished from a material in the regions other than the cutting areas CTA1 and CTA2.

A source/drain region 113 may be disposed on other portions of the channel active regions 111 and 112. The source/drain region 113 may be disposed on the lower insulating film 151. In some example embodiments, the source/drain region 113 may be directly formed over the channel active regions 111 and 112. For example, one source/drain region 113 may be formed on two or more channel active regions 111 and 112 such that the source/drain region 113 directly contacts the channel active regions 111 and 112. The source/drain region 113 may vertically overlap with the channel active regions 111 and 112. The source/drain region 113 may be formed on protruding ends of the channel active regions 111 and 112. The source/drain region 113 may include a semiconductor material and/or a dopant atom (for example, a B, P or As atom).

A first contact electrode 221~223 may be directly disposed on the source/drain region 113. A first branch section 221 and a second branch section 222 of the first contact electrode 221~223 may contact different source/drain regions 113, respectively. The source/drain regions 113, the first branch section 221 and the second branch section 222 may be covered by the first interlayer insulating film 161.

A second interlayer insulating film 162 may be disposed on the first interlayer insulating film 161, to cover the gate structures. In some example embodiments, a top surface of the second interlayer insulating film 162 may be flat. For example, the second interlayer insulating film 162 may be constituted by a silicon oxide film, a silicon nitride film, a silicon oxynitride film, or a combination thereof.

A second contact electrode 230 may extend through the second interlayer insulating film 162 and the gate capping layer 171 and, as such, may contact the gate electrodes 211 to 214. In addition, a stem section 223 of the first contact electrode 221~223 may extend through the second interlayer insulating film 162 in a vertical direction (the third direction D3).

A third interlayer insulating film 163 may be disposed on the second interlayer insulating film 162. The third interlayer insulating film 163 may cover the second interlayer insulating film 162. A top surface of the third interlayer insulating film 163 may be flat. For example, the third interlayer insulating film 163 may be constituted by a silicon nitride film. A first connecting electrode 231 contacting the stem section 223 of the first contact electrode 221~223 and a second connecting electrode 232 contacting the second contact electrode 230 may be formed at the third interlayer insulating film 163. The first connecting electrode 231 and the second connecting electrode 232 may extend through the third interlayer insulating film 163 in the vertical direction (the third direction D3). The first connecting electrode 231 and the second connecting electrode 232 may be electrically connected to a plurality of wirings 30 of a back-end-of-line (BEOL) structure 300.

The structure stacked on the substrate 101 (for example, from the lower insulating film 151 up to the third interlayer insulating film 163) may refer to the FEOL structure 200.

The BEOL structure 300 may be disposed on the FEOL structure 200. The BEOL structure 300 may be formed through a BEOL process. The BEOL process may be referred to a process for interconnecting individual elements, for example, a transistor, a capacitor, a resistor, etc., in a manufacturing procedure for an integrated circuit chip. For example, the BEOL process may include silicidation of a region where a gate is formed (not shown) and a source/drain region, addition of dielectrics, planarization, formation of a hole, addition of a metal layer, formation of a contact plug, formation of a passivation layer, etc. For example, the integrated circuit chip may be packaged in a semiconductor package after execution of the BEOL process and, as such, may be used as an element for various applications.

The BEOL structure 300 may include a plurality of multilayer wiring structures electrically connected to the FEOL structure 200, and a fourth interlayer insulating film 303 for mutually insulating a part of the plurality of multilayer wiring structures. The fourth interlayer insulating film 303 may be formed to cover the FEOL structure 200. For example, the fourth interlayer insulating film 303 may be constituted by a silicon oxide film, a silicon nitride film, a silicon oxynitride film, or a combination thereof. In some example embodiments, a part of layers constituting the fourth interlayer insulating film 303 may be a passivation layer.

Each of the plurality of multilayer wiring structures may include a plurality of wiring layers each including a plurality of wirings 301, and a plurality of vias 302 interconnecting the plurality of wirings 301 between adjacent ones of the plurality of wiring layers. Each of the plurality of wiring layers may be patterned in a horizontal direction (a first direction D1 or a second direction D2). The plurality of vias 302 may be formed in a vertical direction (the third direction D3).

The number of the plurality of wiring layers sequentially stacked in a vertical direction in each of the plurality of multilayer wiring structures may be diversely selected without being particularly limited.

In some example embodiments, bumps 500 may be disposed on the BEOL structure 300. The bumps 500 may be electrically connected to at least a part of the plurality of wirings 301 in the BEOL structure 300. For example, the bumps 500 may include chrome/chrome-copper alloy/copper (Cr/Cr-Cu/Cu), titanium-tungsten alloy/copper (Ti-W/Cu), aluminum/nickel/copper (Al/Ni/Cu), or nickel. The bumps 500 may be formed through sputtering, electroplating or electroless plating.

Hereinafter, a procedure of forming gate electrodes 211 to 214 and a first contact electrode 221~223 on a substrate 101 formed with channel active regions 111 and 112 will be described.

FIGS. 5 to 9 are layouts explaining, on an operation basis, a method for manufacturing an integrated circuit chip in accordance with an example embodiment of the disclosure.

Figure 5:
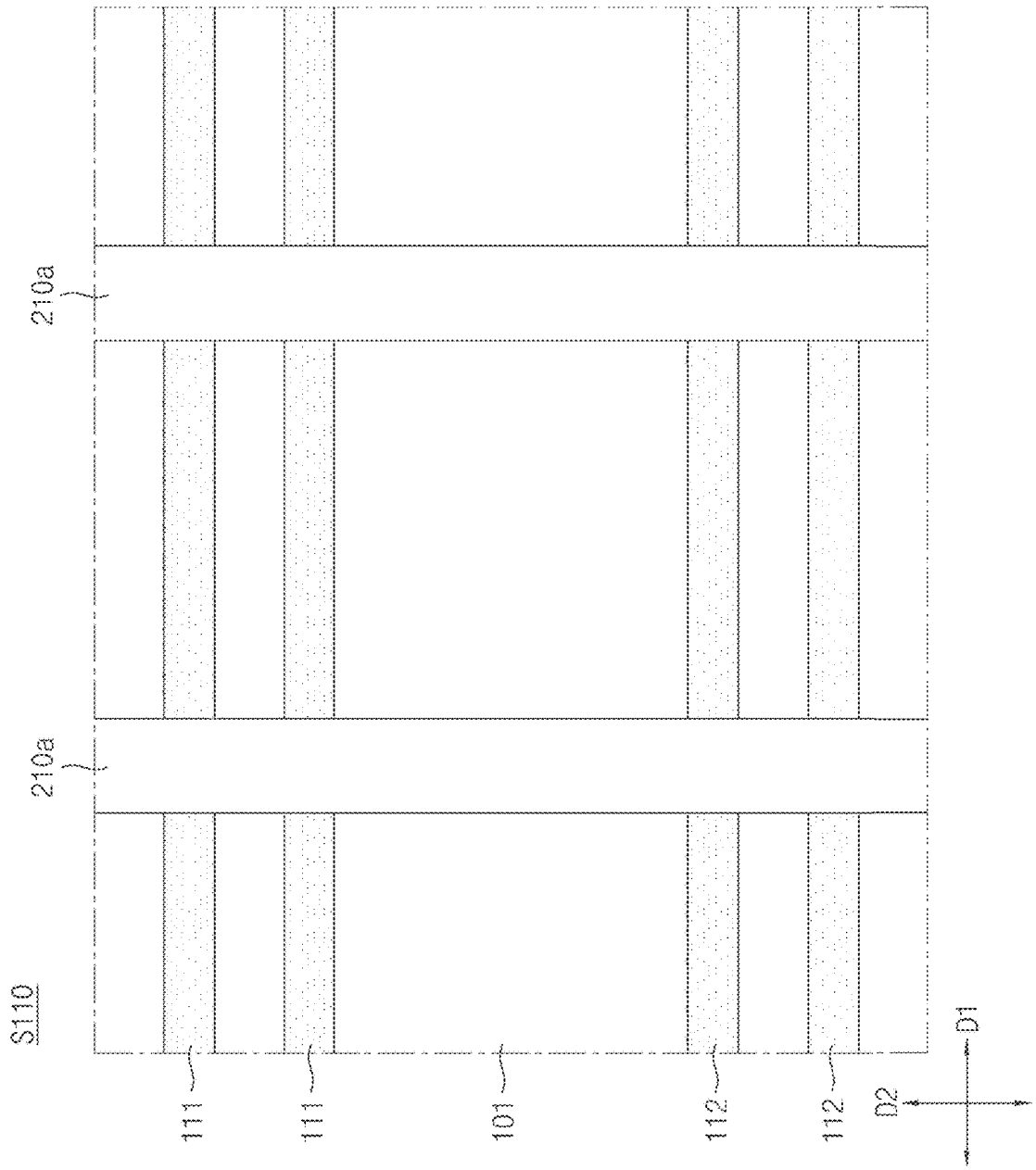
FIGS. 5 to 9 are layouts explaining, on an operation basis, a method for manufacturing an integrated circuit chip in accordance with an example embodiment of the disclosure.

Referring to FIG. 5, in operation S110, a gate sacrificial material 210a extending in a second direction D2 may be formed on a substrate 101 formed with channel active regions 111 and 112 extending in a first direction D1. The gate sacrificial material 210a may be formed on the channel active regions 111 and 112, to intersect the channel active regions 111 and 112.

Figure 6:
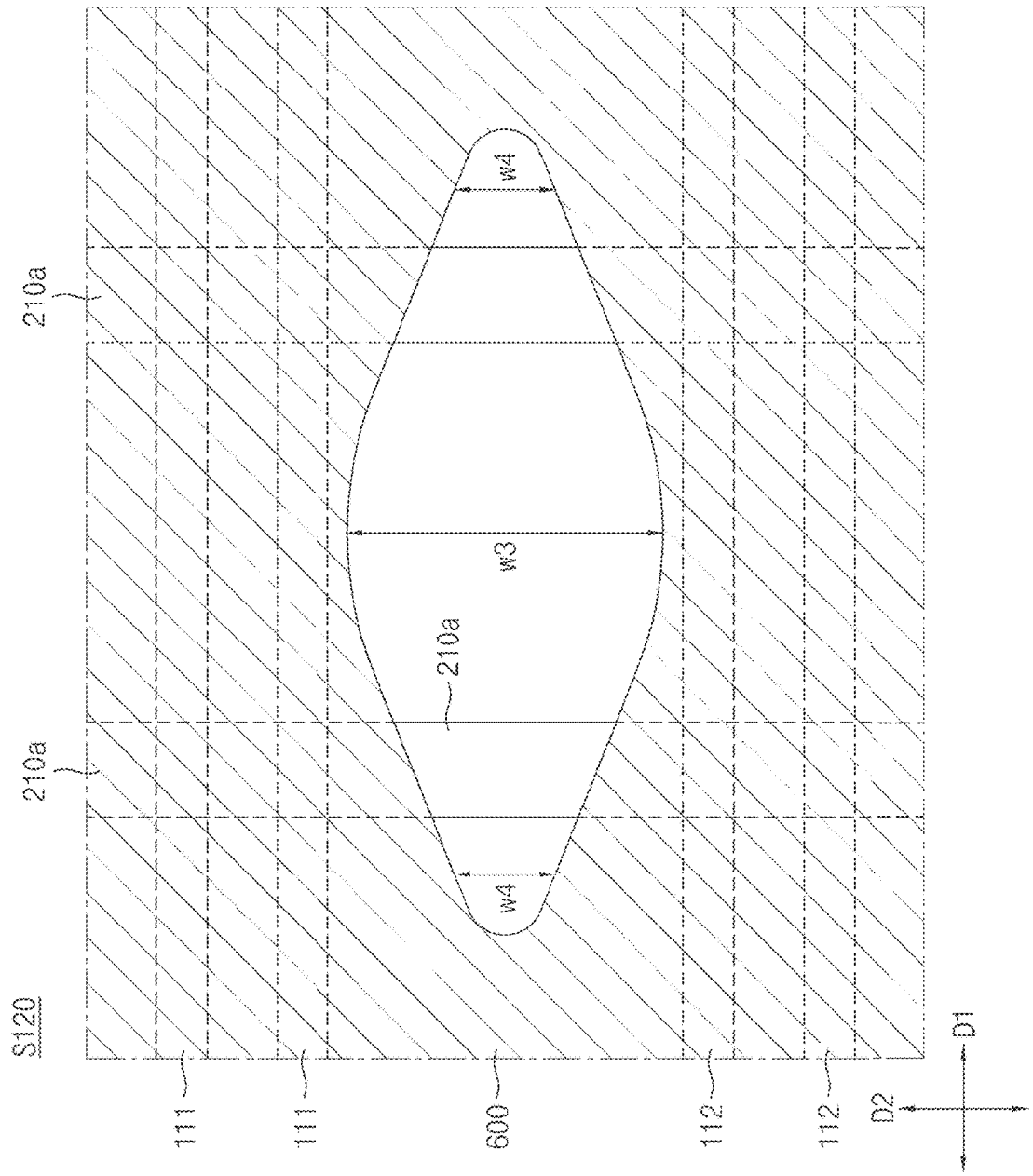

Referring to FIG. 6, in operation S120, a mask 600 having an opening to remove a portion of the gate sacrificial material 210a may be disposed over the gate sacrificial material 210a. In some example embodiments, the opening of the mask 600 may have a substantially (e.g., exactly or about) oval shape. The opening of the mask 600 may be disposed to overlap with portions of two gate sacrificial materials 210a. The mask 600 may be disposed such that the opening has a virtual axis disposed between the two gate sacrificial materials 210a while extending in the second direction D2 and passing through a center of the opening. In the opening, a width w3 of the central virtual axis extending in the second direction D2 while passing through the center of the opening may be greater than widths w4 of virtual axes extending in the same direction as the central virtual axis while being adjacent to the central virtual axis. The width of the opening in the second direction D2 may decrease gradually as the opening extends away from the center thereof. An edge of the opening may obliquely extend on the two gate sacrificial materials 210a.

Figure 7:
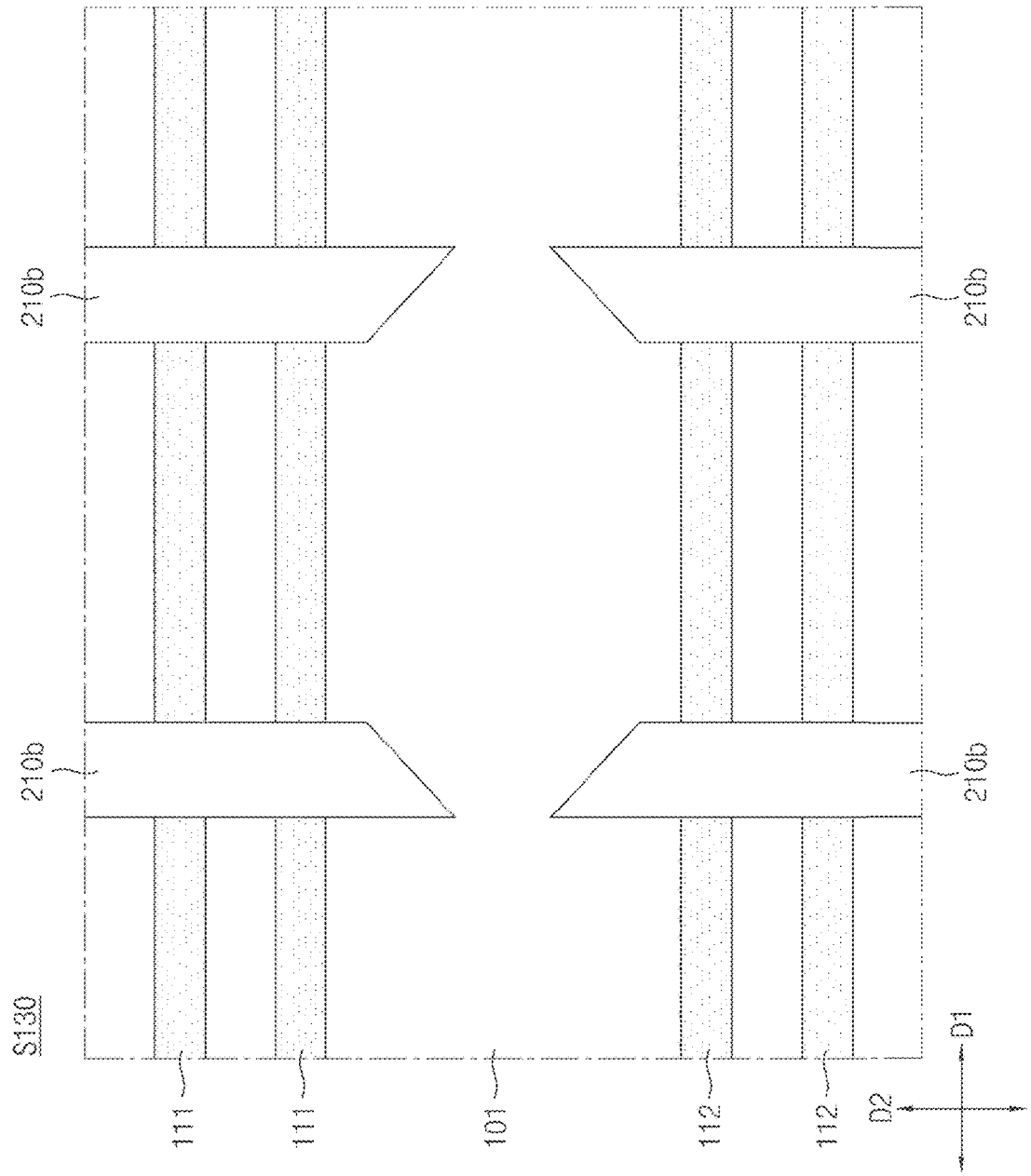

Referring to FIGS. 6 and 7, in operations S120 and S130, portions of the gate sacrificial materials 210a overlapping with the opening may be removed through an etching process. For example, the process of removing the gate sacrificial materials 210a may use at least one of a dry etching process and a wet etching process. As the portions of the gate sacrificial materials 210a are removed through operations S120 and S130, separated gate sacrificial patterns 210b may be formed. For example, the two gate sacrificial materials 210a may be separated into four gate sacrificial patterns 210b in accordance with removal of the portions thereof.

Figure 8:
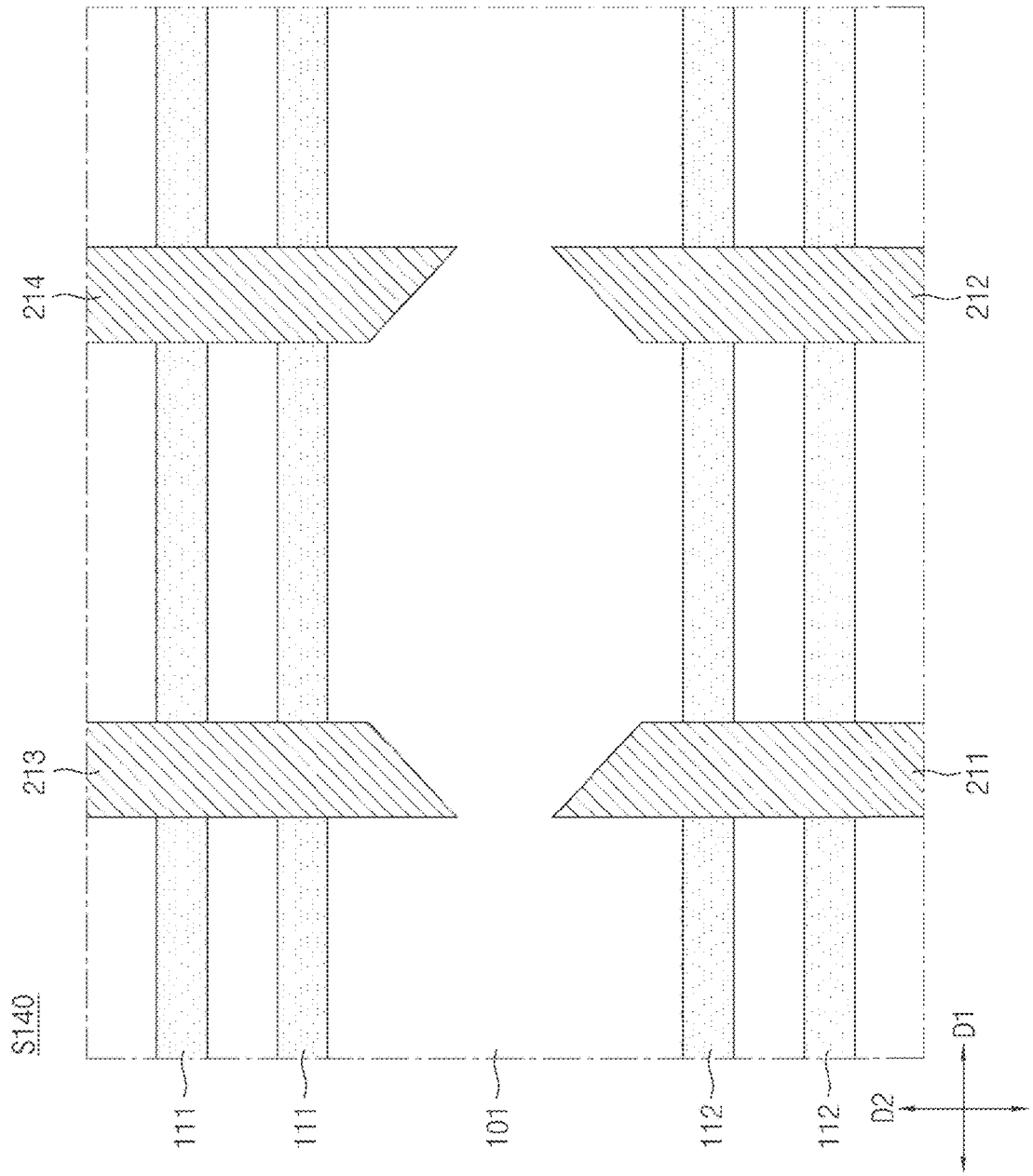

Referring to FIG. 8, after removal of the mask 600, in operation S140, the gate sacrificial patterns 210b may be replaced by gate electrodes 211 to 214. For example, the gate sacrificial patterns 210b may be removed using at least one of a dry etching process and a wet etching process. Subsequently, the gate electrodes 211 to 214 may fill spaces formed through removal of the gate sacrificial patterns 210b.

For example, the gate electrodes 211 to 214 may become first to fourth gate electrodes 211 to 214. The first to fourth gate electrodes 211 to 214 may include a first edge portion RCA1, a second edge portion RCA2, a third edge portion RCA3 and a fourth edge portion RCA4 respectively having a first edge surface EGS1, a second edge surface EGS2, a third edge surface EGS3 and a fourth edge surface EGS4, respectively.

Figure 9:
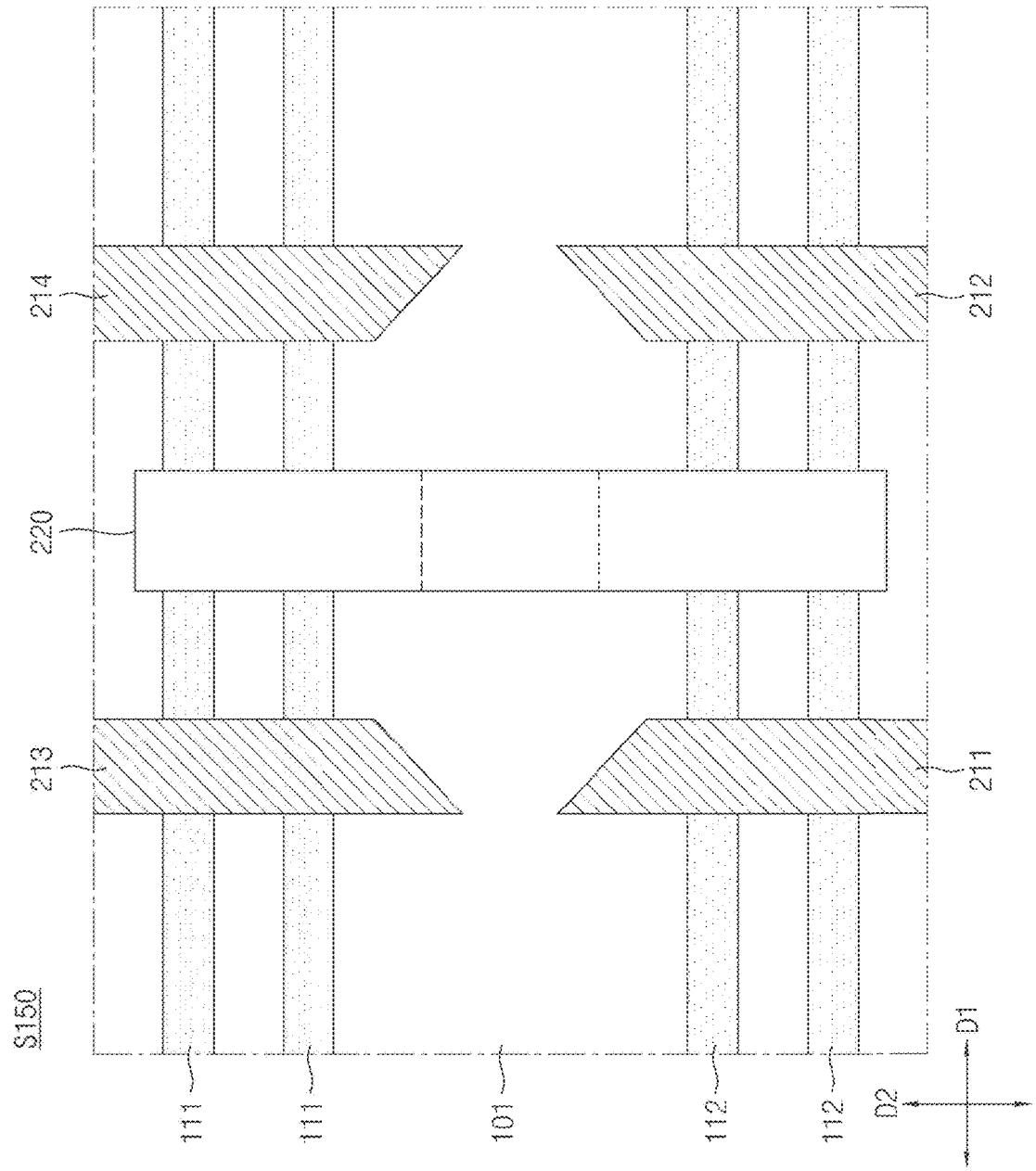

Referring to FIG. 9, in operation S150, a contact electrode material 220 extending in the second direction D2 may be formed between the gate electrodes 211 to 214. Although not clearly shown, the contact electrode material 220 may be formed to contact a source/drain region 113 formed on the channel active regions 111 and 112. Thereafter, opposite corner portions of the contact electrode material 220 may be partially removed and, as such, the contact electrode material 220 may become a first contact electrode 221~223 including a stem section 223, a first branch section 221 and a second branch section 222.

Next, an integrated circuit chip according to another embodiment of the disclosure will be described. In the following description, no description will be given of constituent elements identical to those of FIGS. 1 to 9, and the constituent elements will be designated by reference numerals identical or similar to those of FIGS. 1 to 9.

Figure 10:
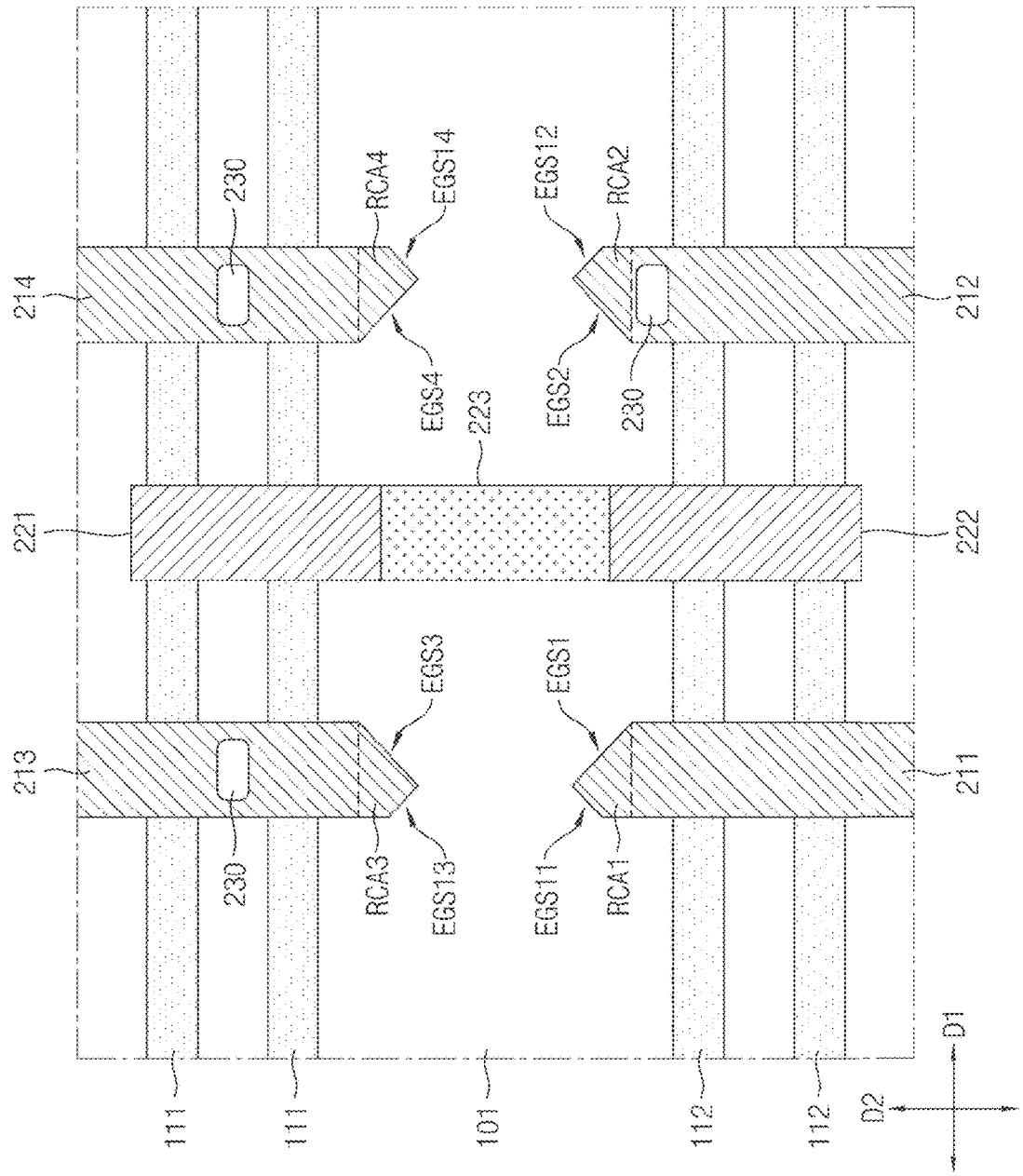
FIG. 10 is a layout of an integrated circuit chip according to an example embodiment of the disclosure.

FIG. 10 is a layout of an integrated circuit chip according to an example embodiment of the disclosure.

Referring to FIG. 10, the integrated circuit chip according to some example embodiments differs from the integrated circuit chip according to the example embodiments of FIG. 1 in terms of shapes of edge portions RCA1 to RCA4.

In some example embodiments, a first edge surface EGS1 and a fifth edge surface EGS11 may be formed at a first edge portion RCA1 of a first gate electrode 211. A second edge surface EGS2 and a sixth edge surface EGS12 may be formed at a second edge portion RCA2 of a second gate electrode 212. A third edge surface EGS3 and a seventh edge surface EGS13 may be formed at a third edge portion RCA3 of a third gate electrode 213. A fourth edge surface EGS4 and an eighth edge surface EGS14 may be formed at a fourth edge portion RCA4 of a fourth gate electrode 214. The following description will be given with reference to the first gate electrode 211, and may also be applied to description of the second to fourth gate electrodes 211 to 214.

The position of the first edge surface EGS1 may be adjacent to the first contact electrode 221~223, as compared to the position of the fifth edge surface EGS11. A virtual normal (e.g., perpendicular) line extending from the first edge surface EGS1 may be directed to the first contact electrode 221~223, but a virtual normal line extending from the fifth edge surface EGS11 may not be directed to the first contact electrode 221~223. A point (or a side), at which the first edge surface EGS1 and the fifth edge EGS11 meet, may constitute one end of the first gate electrode 211. In some example embodiments, the area of the first edge surface EGS1 may be greater than the area of the fifth edge surface EGS11.

Figure 11:
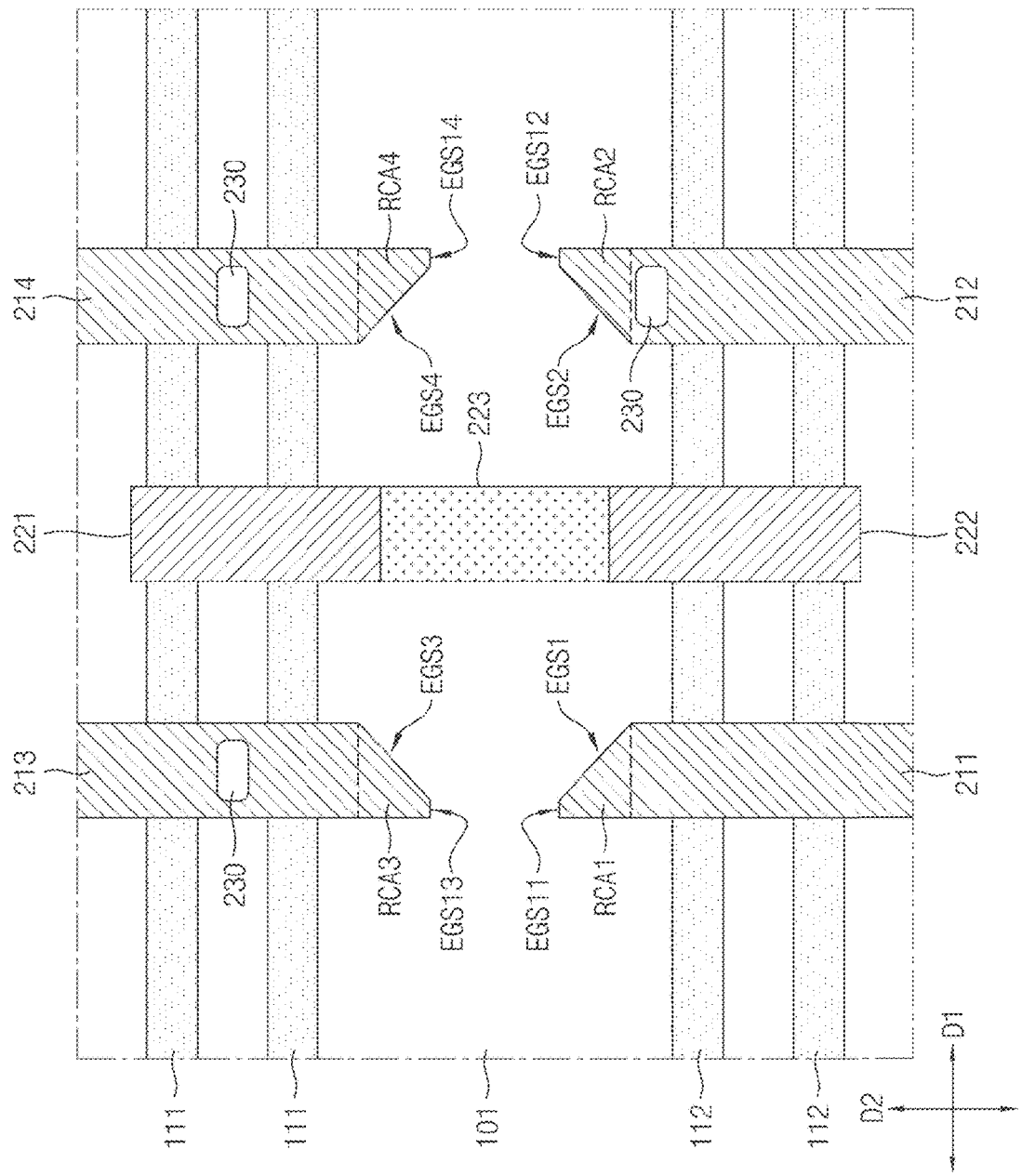
FIG. 11 is a layout of an integrated circuit chip according to an example embodiment of the disclosure.

FIG. 11 is a layout of an integrated circuit chip according to an example embodiment of the disclosure.

Referring to FIG. 11, the integrated circuit chip according to some example embodiments differs from the integrated circuit chip according to the example embodiments of FIG. 1 in terms of shapes of edge portions RCA1 to RCA4.

Each end of first to fourth gate electrodes 211 to 214 may be a surface. For example, a first edge surface EGS1 and a fifth edge surface EGS11 may be formed at a first edge portion RCA1 of the first gate electrode 211. A second edge surface EGS2 and a sixth edge surface EGS12 may be formed at a second edge portion RCA2 of the second gate electrode 212. A third edge surface EGS3 and a seventh edge surface EGS13 may be formed at a third edge portion RCA3 of the third gate electrode 213. A fourth edge surface EGS4 and an eighth edge surface EGS14 may be formed at a fourth edge portion RCA4 of the fourth gate electrode 214. The fifth to eighth edge surfaces EGS11 to EGS14 may constitute ends of the first to fourth gate electrodes 211 to 214, respectively.

Figure 12:
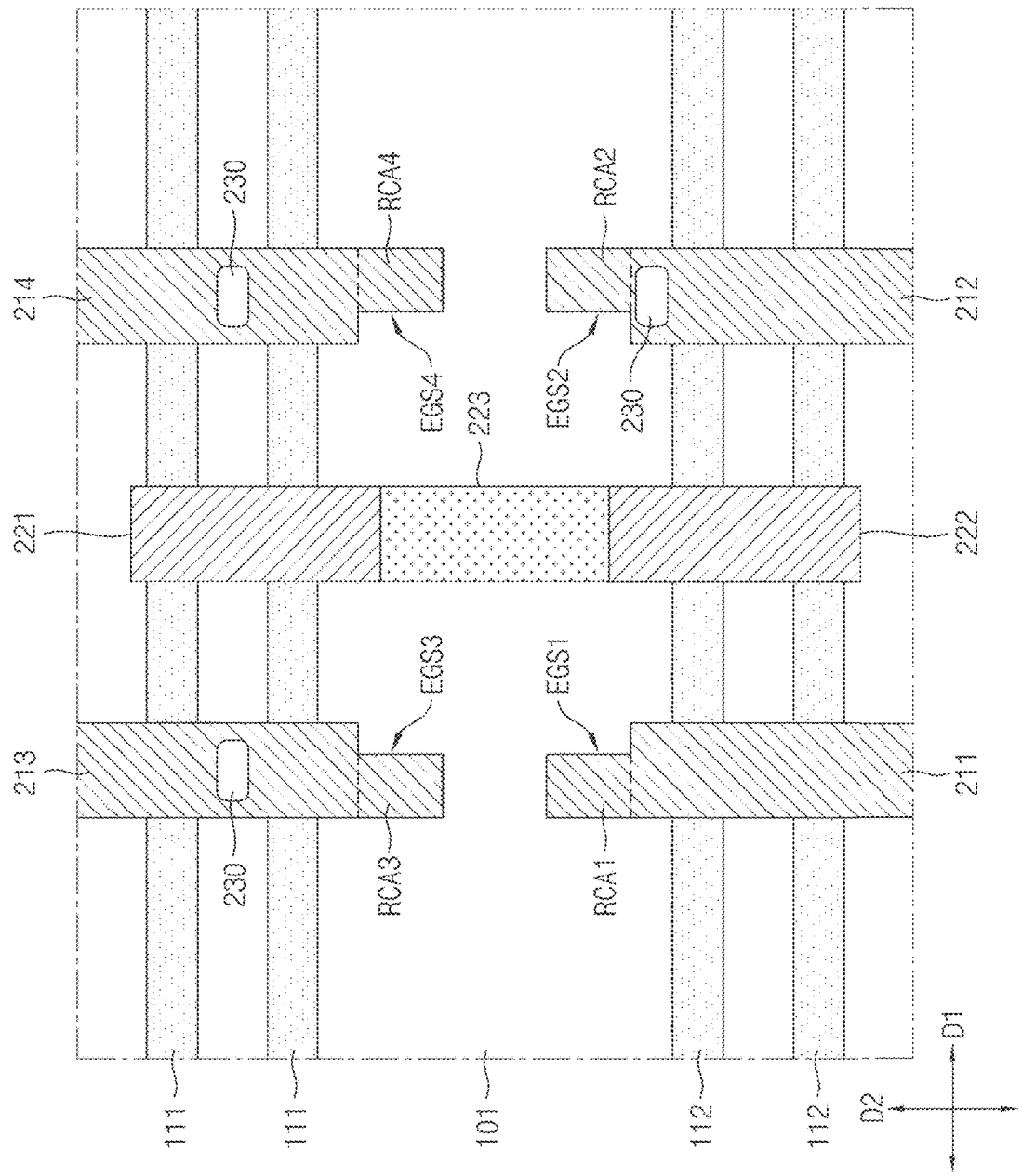
FIG. 12 is a layout of an integrated circuit chip according to an example embodiment of the disclosure.

FIG. 12 is a layout of an integrated circuit chip according to an example embodiment of the disclosure.

Referring to FIG. 12, the integrated circuit chip according to some example embodiments differs from the integrated circuit chip according to the example embodiments of FIG. 1 in terms of shapes of edge portions RCA1 to RCA4.

In some example embodiments, widths of the edge portions RCA1 to RCA4 may be equal. The widths of the gate electrodes 211 to 214 may be smaller at the edge portions RCA1 to RCA4 than at portions of the gate electrodes 211 to 214 other than the edge portions RCA1 to RCA4, but may be uniform at the edge portions RCA1 to RCA4. Accordingly, each end of the first to fourth gate electrodes 211 to 214 may be a surface.

A first edge surface EGS1, a second edge surface EGS2, a third edge surface EGS3, and a fourth edge surface EGS4 may extend in a second direction D2. Each normal line of the first edge surface EGS1, the second edge surface EGS2, the third edge surface EGS3, and the fourth edge surface EGS4 may extend in a first direction D1.

Figure 13:
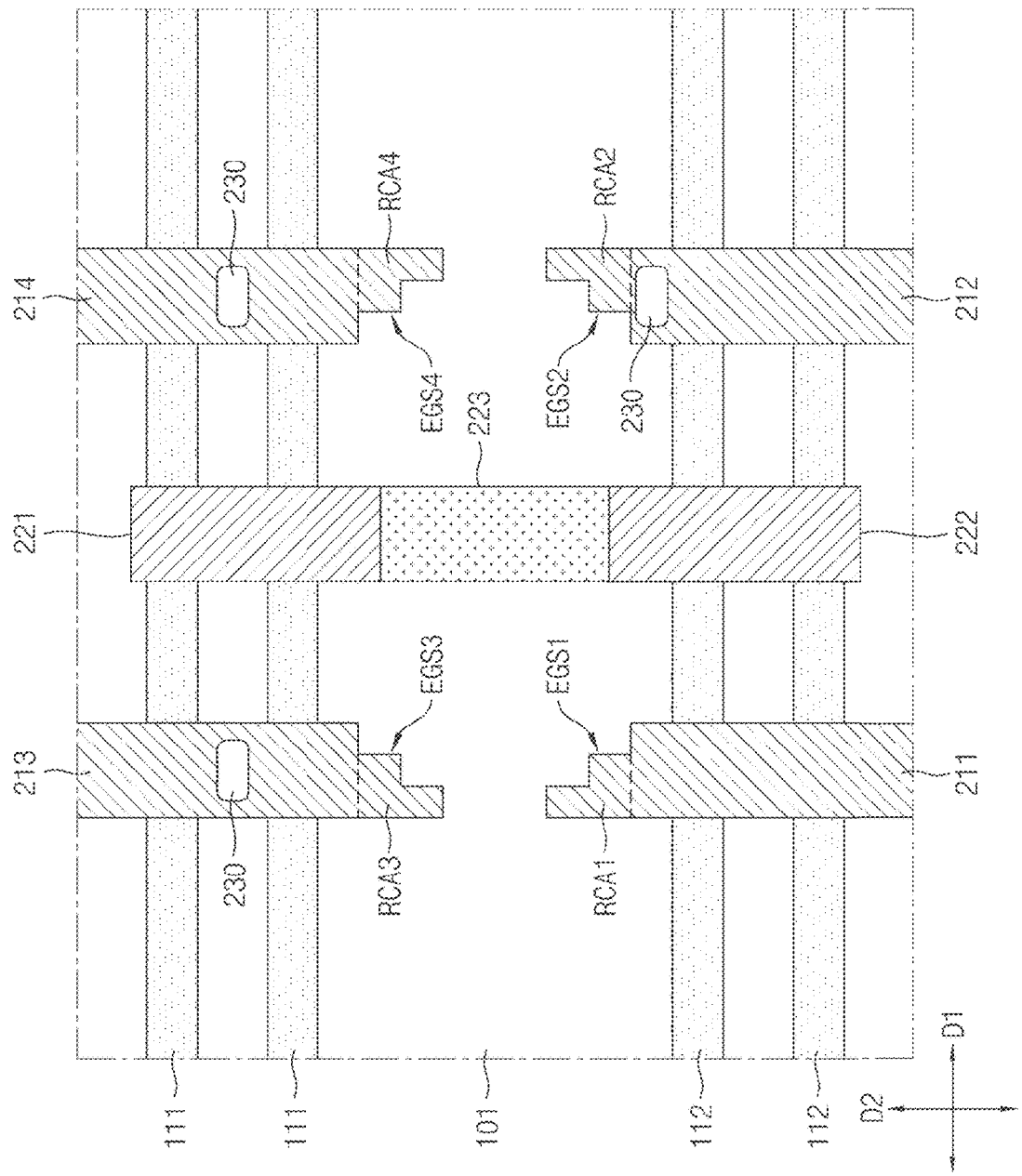
FIG. 13 is a layout of an integrated circuit chip according to an example embodiment of the disclosure.

FIG. 13 is a layout of an integrated circuit chip according to an example embodiment of the disclosure.

Referring to FIG. 13, the integrated circuit chip according to some example embodiments differs from the integrated circuit chip according to the example embodiments of FIG. 1 in terms of shapes of edge portions RCA1 to RCA4.

In some example embodiments, widths of the edge portions RCA1 to RCA4 may decrease stepwise as the edge portions RCA1 to RCA4 extend toward ends of gate electrodes 211 to 214, respectively. That is, the distance from each of the edge portions RCA1 to RCA4 to a first contact electrode 221~223 in a first direction D1 may increase stepwise as the edge portions RCA1 to RCA4 extend toward the ends of the gate electrodes 211 to 214, respectively.

Figure 14:
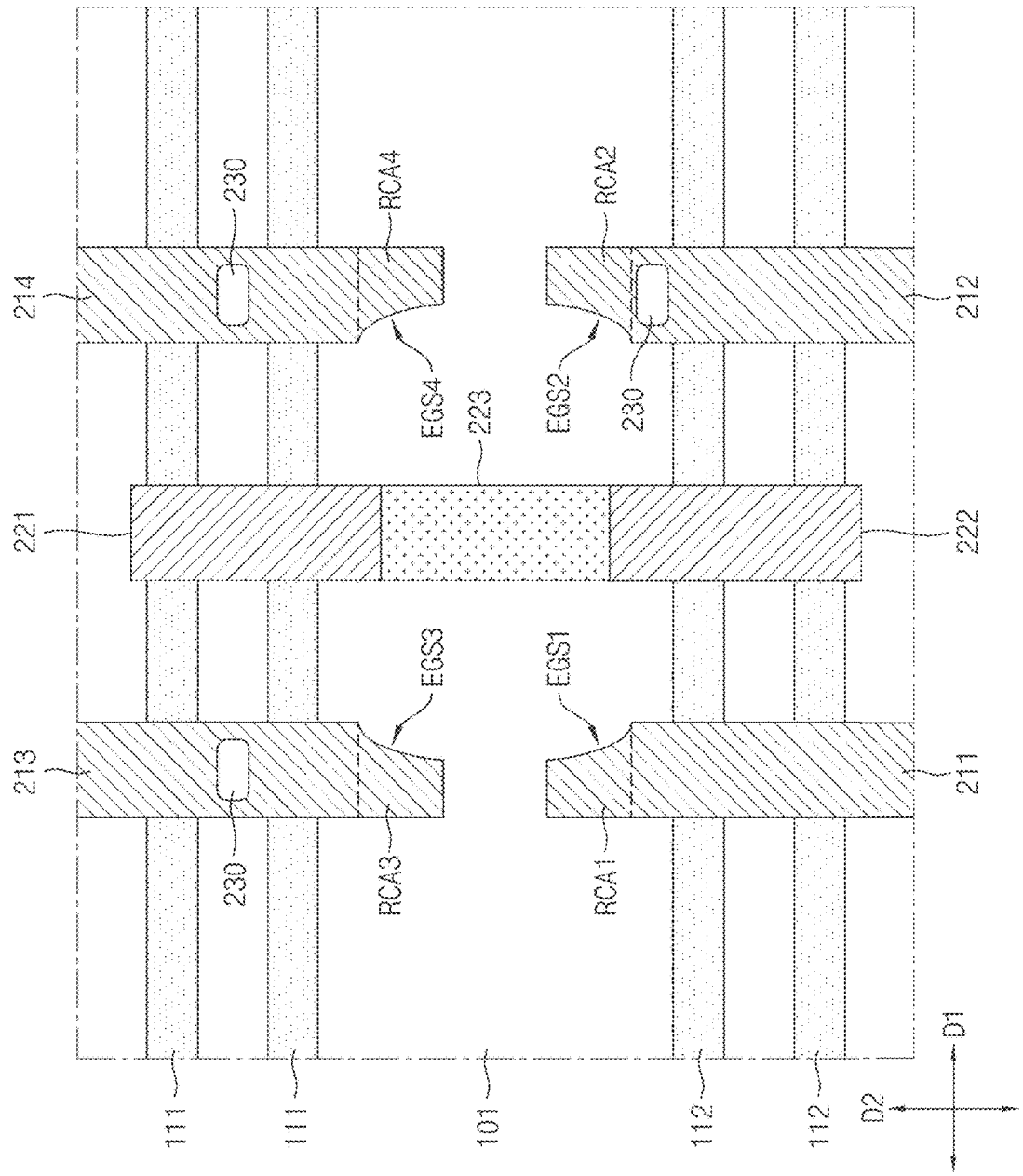
FIG. 14 is a layout of an integrated circuit chip according to an example embodiment of the disclosure.

FIG. 14 is a layout of an integrated circuit chip according to an example embodiment of the disclosure.

Referring to FIG. 14, the integrated circuit chip according to some example embodiments differs from the integrated circuit chip according to the example embodiments of FIG. 1 in terms of shapes of edge portions RCA1 to RCA4.

In some example embodiments, each of a first edge surface EGS1, a second edge surface EGS2, a third edge surface EGS3, and a fourth edge surface EGS4 may be a curved surface. For example, each of the first edge surface EGS1, the second edge surface EGS2, the third edge surface EGS3, and the fourth edge surface EGS4 may be a concave curved surface. Widths of the edge portions RCA1 to RCA4 may decrease gradually as the edge portions RCA1 to RCA4 extend toward ends of gate electrodes 211 to 214, respectively. In some example embodiments, variation rates of widths of the edge portions RCA1 to RCA4 may be varied as the edge portions RCA1 to RCA4 extend toward ends of gate electrodes 211 to 214, respectively. Variation rates of widths of the edge portions RCA1 to RCA4 may decrease as the edge portions RCA1 to RCA4 extend toward ends of gate electrodes 211 to 214, respectively.

Figure 15:
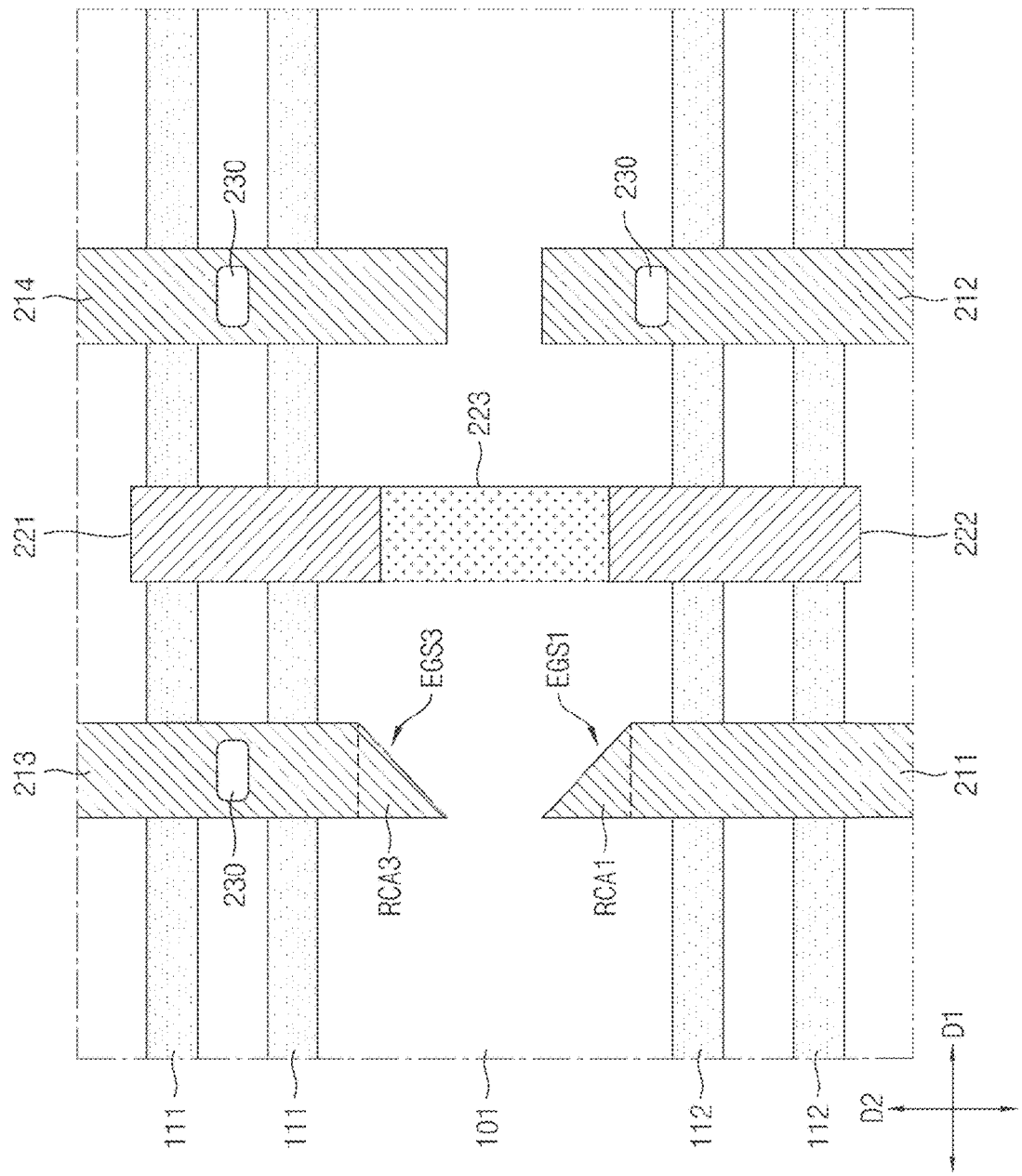
FIG. 15 is a layout of an integrated circuit chip according to an example embodiment of the disclosure.

FIG. 15 is a layout of an integrated circuit chip according to an example embodiment of the disclosure.

Referring to FIG. 15, the integrated circuit chip according to some example embodiments differs from the integrated circuit chip according to the example embodiments of FIG. 1 in that edge portions are included in only a part of gate electrodes 211 to 214.

In some example embodiments, a first gate electrode 211 and a third gate electrode 213, which are disposed to extend in a second direction D2, may include edge portions RCA1 and RCA3, respectively, but a second gate electrode 212 and a fourth gate electrode 214, which are disposed to extend in the second direction D2 while being adjacent to the first gate electrode 211 and the third gate electrode 213, may not include an edge portion. However, the example embodiments are not limited thereto and others of the gate electrodes 211 to 214 may not include an edge portion, while others of the gate electrodes 211 to 214 may include an edge portion.

Figure 16:
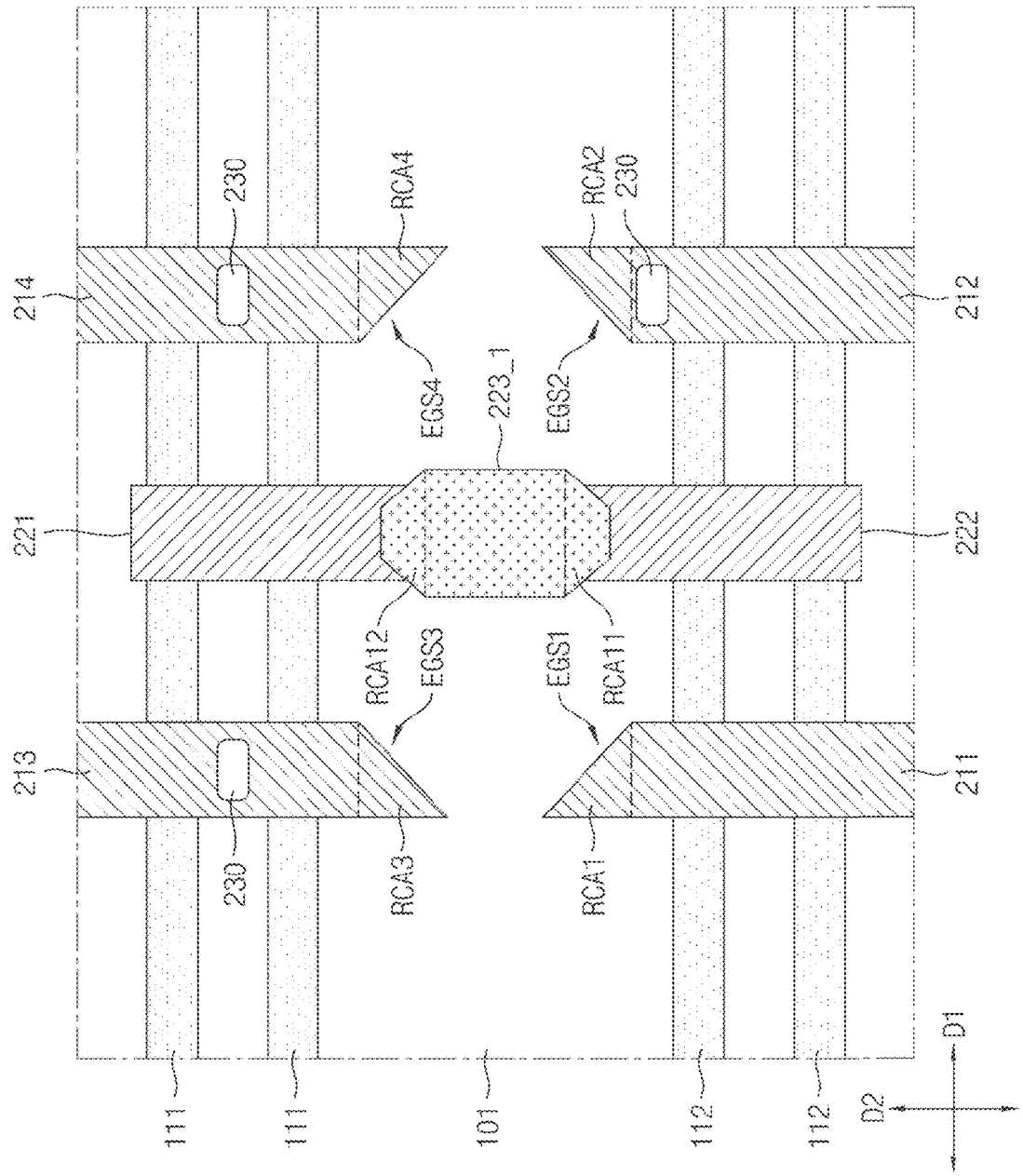
FIG. 16 is a layout of an integrated circuit chip according to an example embodiment of the disclosure.

FIG. 16 is a layout of an integrated circuit chip according to an example embodiment of the disclosure.

Referring to FIG. 16, the integrated circuit chip according to some example embodiments differs from the integrated circuit chip according to the example embodiments of FIG. 1 in terms of the shape of a stem section 223_1 formed at a first contact electrode 221-222-223_1.

In some example embodiments, the stem section 223_1 formed at the first contact electrode 221-222-223_1 may be configured such that the width thereof decreases gradually as the stem section 223_1 extends toward an end thereof in a second direction D2. The stem section 223_1 may include a fifth edge portion RCA11 and a sixth edge portion RCA12 which include ends in the second direction D2, respectively. Although a cross-section of the stem section 223_1 is shown as having a substantially (e.g., exactly or about) octagonal shape by virtue of the fifth edge portion RCA11 and the sixth edge portion RCA12, the example embodiments of the disclosure are not limited thereto. Since the stem section 223_1 includes the fifth edge portion RCA11 and the sixth edge portion RCA12, the distance between the stem section 223_1 and gate electrodes 211 to 214 may be maximized and, as such, occurrence of short circuit between the stem section 223_1 and the gate electrodes 211 to 214 may be minimized.

Figure 17:
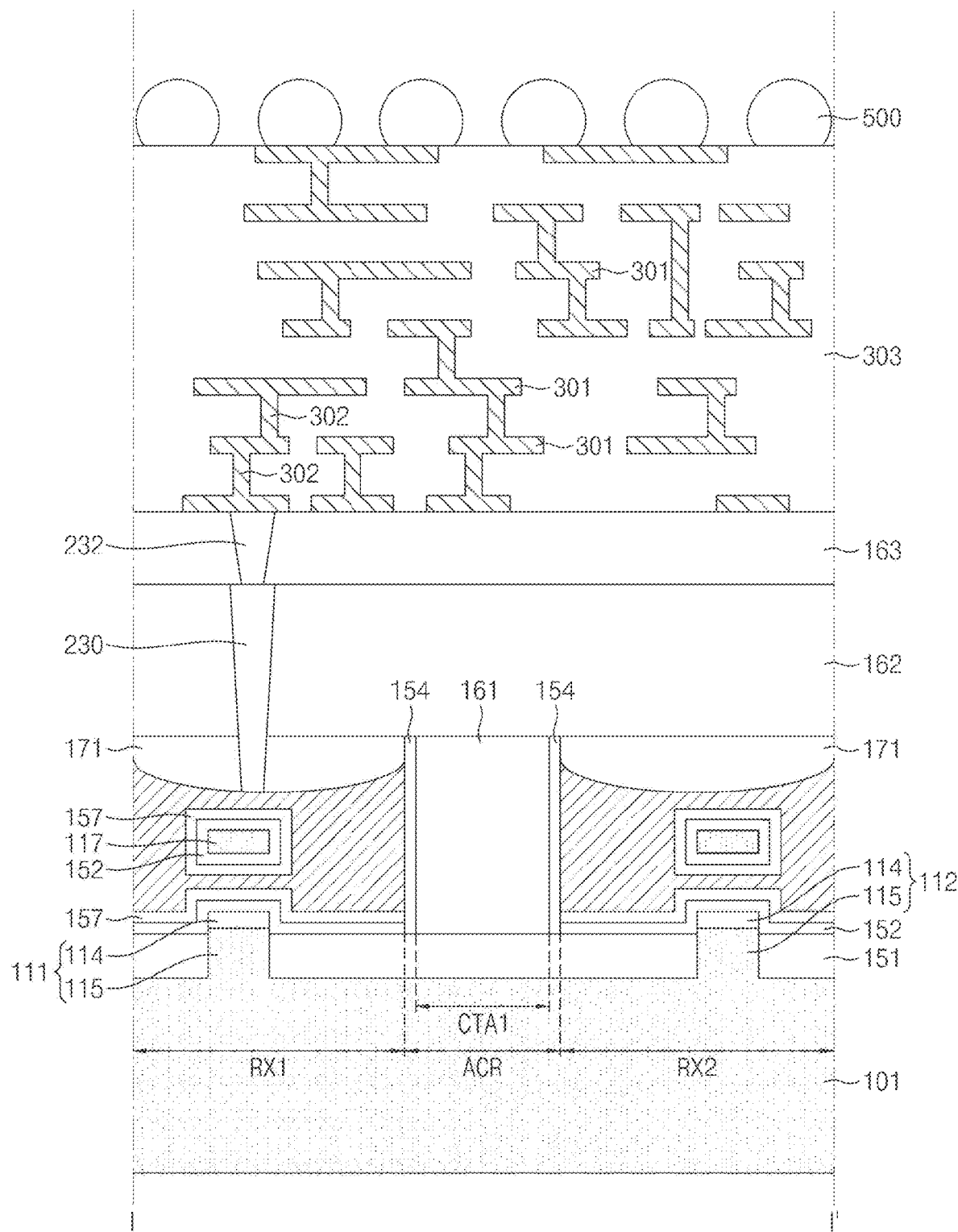
FIG. 17 is a layout of an integrated circuit chip according to an example embodiment of the disclosure.

FIG. 17 is a layout of an integrated circuit chip according to an example embodiment of the disclosure.

Referring to FIG. 17, the integrated circuit chip according to some example embodiments differs from the integrated circuit chip according to the example embodiments of FIG. 4 in terms of the shape of channel active regions 111 and 112 and the shape of gate electrodes 211 to 214.

In some example embodiments, each of the channel active regions 111 and 112 may include a lower pattern 115 and an upper pattern 114. The lower pattern 115 may be a semiconductor pattern including a semiconductor material similar to a material of a substrate 101. The upper pattern 114 may be an insulating pattern including an insulating material.

In some example embodiments, the upper pattern 114 may be formed to protrude above a top surface of a lower insulating film 151.

Each of the gate electrodes 211 to 214 may include a metal layer 157. The metal layer 157 may be a metal layer capable of adjusting a work function. The metal layer 157 may be formed not only along bottoms of the gate electrodes 211 to 214, but also along a top surface of the lower insulating film 151 and a top of the upper pattern 114. For example, the metal layer 157 may include at least one of TIN, WN, TaN, Ru, TiC, TaC, Ti, Ag, Al, TiAl, TiAlN, TiAlC, TaCN, TaSiN, Mn, and Zr.

A wire pattern 117 may be formed to extend through insides of the gate electrodes 211 to 214. Although not clearly shown, the wire pattern 117 may be formed on the substrate 101, and may extend in a first direction D1. The wire pattern 117 may overlap with the upper pattern 114. For example, the width of the wire pattern 117 may be equal to the widths of the channel active regions 111 and 112.

For example, the wire pattern 117 may not be formed on the lower insulating film 151, but may be formed on the channel active regions 111 and 112. The wire pattern 117 may be used as a channel region. The wire pattern 117 may be varied in accordance with whether the integrated circuit chip is PMOS or NMOS. In some example embodiments, the wire pattern 117 may include the same material as the lower pattern 115.

A gate insulating film 152 may be formed between the wire pattern 117 and the gate electrodes 211 to 214. The gate insulating film 152 may be conformally formed along a periphery of the wire pattern 117. A metal layer 157 may be disposed between the gate insulating film 152 and the wire pattern 117.

In accordance with the example embodiments of the disclosure, the distance between a gate electrode and a contact electrode adjacent thereto may be increased.

Accordingly, a short circuit between the gate electrode and the contact electrode adjacent thereto may be prevented (e.g., by reducing the occurrence of short circuits).

When the terms "about" or "substantially" are used in this specification in connection with a numerical value, it is intended that the associated numerical value includes a manufacturing or operational tolerance (e.g., +10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes.

While the example embodiments of the disclosure have been described with reference to the accompanying drawings, it should be understood by those skilled in the art that various modifications may be made without departing from the scope of the disclosure and without changing essential features thereof. Therefore, the above-described example embodiments should be considered in a descriptive sense only and not for purposes of limitation.

What is claimed is:

1. An integrated circuit chip comprising:
   a substrate;
   first channel active regions on the substrate, and extending in a first direction;
   second channel active regions on the substrate, and extending in the first direction, the second channel active regions being spaced apart from the first channel active regions in a second direction intersecting the first direction;
   a first gate electrode and a second gate electrode which intersect the second channel active regions;
   a third gate electrode and a fourth gate electrode which intersect the first channel active regions; and a contact electrode between the first gate electrode and the second gate electrode and between the third gate electrode and the fourth gate electrode, the contact electrode including
a stem section in a vertical direction,
a first branch section extending from the stem section in one direction and contacting a source/drain region on the first channel active regions, and
a second branch section extending from the stem section in the other direction and contacting a source/drain region on the second channel active regions,
wherein the first gate electrode and the third gate electrode overlap with each other in the second direction,
wherein the first gate electrode includes a first main portion intersecting the second channel active regions, and a first edge portion extending from the first main portion and facing the third gate electrode,
wherein the first edge portion has a width smaller than a width of the first main portion, and
wherein a distance in the first direction between the first edge portion and the contact electrode is larger than a distance in the first direction between the first main portion and the contact electrode.

2. The integrated circuit chip according to claim 1, wherein the width of first edge portion decreases gradually as the first edge portion extend toward facing an end of the first edge portion.

3. The integrated circuit chip according to claim 1, wherein the first edge portion includes a first edge surface facing the stem section and a second edge surface opposing the first edge surface.

4. The integrated circuit chip according to claim 3, wherein a distance in the first direction between the first edge surface and the contact electrode increases gradually as the first edge surface extends toward an end of the first edge portion.

5. The integrated circuit chip according to claim 4, wherein the second edge surface is parallel to the first direction.

6. The integrated circuit chip according to claim 4, wherein the first edge surface is a concave curved surface.

7. The integrated circuit chip according to claim 1, wherein the third gate electrode includes a third main portion intersecting the first channel active regions, and a third edge portion extending from the third main portion and facing the first gate electrode,
wherein the third edge portion has a width being smaller than a width of the third main portion.

8. The integrated circuit chip according to claim 7, wherein the width of the third edge portion decreases gradually as the third edge portion extend toward facing an end of the third edge portion.

9. The integrated circuit chip according to claim 7, wherein the second gate electrode and the fourth gate electrode overlap with each other in the second direction,
wherein the second gate electrode includes a second main portion intersecting the second channel active regions, and a second edge portion extending from the second main portion and facing the fourth gate electrode, and the fourth gate electrode includes a fourth main portion intersecting the first channel active regions, and a fourth edge portion extending from the fourth main portion and facing the second gate electrode,
wherein the second and fourth edge portions have widths being smaller than widths of the second and fourth main portions, respectively.

10. The integrated circuit chip according to claim 7, wherein each of the second and fourth gate electrodes has a uniform width.

11. An integrated circuit chip comprising:
a substrate;
first channel active regions on the substrate, and extending in a first direction;
second channel active regions on the substrate, and extending in the first direction, the second channel active regions being spaced apart from the first channel active regions in a second direction intersecting the first direction;
a first gate electrode and a second gate electrode which intersect the second channel active regions;
a third gate electrode and a fourth gate electrode which intersect the first channel active regions; and
a contact electrode between the first gate electrode and the second gate electrode and between the third gate electrode and the fourth gate electrode, the contact electrode including
a stem section in a vertical direction,
a first branch section extending from the stem section in one direction and contacting a source/drain region on the first channel active regions, and
a second branch section extending from the stem section in the other direction and contacting a source/drain region on the second channel active regions,
wherein the first gate electrode and the third gate electrode overlap with each other in the second direction,
wherein each of the first gate electrode and the third gate electrode includes a first main portion overlapping the first or second branch section in the first direction, and a first edge portion extending from the first main portion in the second direction and overlapping the stem section in the first direction,
wherein the first edge portion has a first width smaller than a second width of the first main portion, and
wherein a first distance in the first direction between the first edge portion and the stem section is larger than a second distance in the first direction between the first main portion and the second branch section.

12. An integrated circuit chip according to claim 11, wherein the first width of the first edge portion decreases gradually as the first edge portion extends toward an end of each of the first and third gate electrodes.

13. The integrated circuit chip according to claim 12, wherein the first edge portion includes a first edge surface facing the stem section, and the first edge surface is a concave curved surface.

14. The integrated circuit chip according to claim 11, wherein the first width of the first edge portion decreases stepwise as the first edge portion extends toward an end of each of the first and third gate electrodes.

15. The integrated circuit chip according to claim 11, wherein each of the second gate electrode and the fourth gate electrode includes a second main portion overlapping the first or second branch section in the first direction, and a second edge portion extending from the first main portion in the second direction and overlapping the stem section in the first direction,
wherein the second edge portion has a third width smaller than a fourth width of the second main portion,
wherein a third distance in the first direction between the second edge portion and the contact electrode is larger than a fourth distance in the first direction between the second main portion and the contact electrode.

16. An integrated circuit chip comprising:
a substrate;
a front-end-of-line (FEOL) structure on the substrate;
a back-end-of-line (BEOL) structure on the FEOL structure, the BEOL structure including a plurality of wiring layers; and
bumps on the BEOL structure,
wherein the FEOL structure includes
  first channel active regions protruding from the substrate, and extending in a first direction,
  second channel active regions protruding from the substrate, and extending in the first direction, the second channel active regions being spaced apart from the first channel active regions in a second direction intersecting the first direction,
  a first gate electrode and a second gate electrode which intersect the second channel active regions,
  a third gate electrode and a fourth gate electrode which intersect the first channel active regions, and
  a contact electrode between the first gate electrode and the second gate electrode and between the third gate electrode and the fourth gate electrode, the contact electrode including
    a stem section in a vertical direction,
    a first branch section extending from the stem section in one direction and contacting a source/drain region on the first channel active regions, and
    a second branch section extending from the stem section in the other direction and contacting a source/drain region on the second channel active regions,
  wherein the first gate electrode and the third gate electrode overlap with each other in the second direction,
  wherein each of the first gate electrode and the third gate electrode includes a first edge portion, overlapping the stem section in the first direction and having a first width smaller than a first maximum width of each of the first and third gate electrodes, and
  wherein the first width of the first edge portion decreases as the first edge portion extends toward an end of each of the first and third gate electrodes.

17. The integrated circuit chip according to claim 16, wherein the first edge portion includes a first edge surface facing the stem section and a second edge surface opposing the first edge surface, and the first edge surface is a concave curved surface.

18. The integrated circuit chip according to claim 17, wherein the second edge surface is parallel to the first direction.

19. The integrated circuit chip according to claim 17, wherein the first width of the first edge portion decreases stepwise as the first edge portion extends toward an end of each of the first and third gate electrodes.

20. The integrated circuit chip according to claim 16, wherein each of the second gate electrode and the fourth gate electrode includes a second edge portion, overlapping the stem section in the first direction and having a second width smaller than a second maximum width of each of the first and third gate electrodes,
  wherein the second width of the second edge portion decreases as the second edge portion extends toward an end of each of the second and fourth gate electrodes.

* * * * *